US007354522B2

(12) United States Patent
Kneezel et al.

(10) Patent No.: US 7,354,522 B2
(45) Date of Patent: Apr. 8, 2008

(54) SUBSTRATE ETCHING METHOD FOR FORMING CONNECTED FEATURES

(75) Inventors: Gary A. Kneezel, Webster, NY (US); John A. Lebens, Rush, NY (US); Christopher N. Delametter, Rochester, NY (US); David P. Trauernicht, Rochester, NY (US); James M. Chwalek, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 408 days.

(21) Appl. No.: 10/911,183

(22) Filed: Aug. 4, 2004

(65) Prior Publication Data

US 2006/0027521 A1 Feb. 9, 2006

(51) Int. Cl.
*H01L 21/311* (2006.01)
*B44C 1/22* (2006.01)

(52) U.S. Cl. ............................ 216/37; 347/22; 347/29; 347/34; 347/47; 347/64; 347/67; 216/27; 216/100; 216/2; 438/694; 438/733

(58) Field of Classification Search .................. 216/27, 216/100, 2, 37; 347/22, 29, 34, 47, 64, 67; 438/694, 733
See application file for complete search history.

(56) References Cited

U.S. PATENT DOCUMENTS 3,765,969 A 10/1973 Kragness et al.
4,601,777 A 7/1986 Hawkins et al.
4,639,748 A 1/1987 Drake et al.
4,685,198 A 8/1987 Kawakita et al.
4,774,530 A 9/1988 Hawkins
5,504,026 A * 4/1996 Kung .......................... 438/50
6,264,850 B1 * 7/2001 Silverbrook ................. 216/27
6,502,930 B1 * 1/2003 Shimada et al. .............. 347/71

* cited by examiner

*Primary Examiner*—Ram Kackar
*Assistant Examiner*—Viji Narasimhan Bernard
(74) *Attorney, Agent, or Firm*—William R. Limmerli

(57) ABSTRACT

A method of etching a substrate and an article(s) formed using the method are provided. The method includes providing a substrate; coating a region of the substrate with a temporary material having properties that enable the temporary material to remain substantially intact during subsequent processing and enable the temporary material to be removed by a subsequent process that allows the substrate to remain substantially unaltered; removing a portion of the substrate to form a feature, at least some of the removed portion of the substrate overlapping at least a portion of the coated region of the substrate while allowing the temporary material substantially intact; and removing the temporary material while allowing the substrate to remain substantially unaltered.

38 Claims, 22 Drawing Sheets

SUBSTRATE ETCHING METHOD FOR FORMING CONNECTED FEATURES

CROSS REFERENCE TO RELATED APPLICATIONS

Reference is made to commonly assigned, pending U.S. patent application Ser. No. 10/911,186 filed concurrently herewith, entitled "A FLUID EJECTOR HAVING AN ANISOTROPIC SURFACE CHAMBER ETCH", in the name of James M. Chwalek, et al., the disclosure of which is incorporated herein by reference.

FIELD OF THE INVENTION

The present invention relates, generally, to the etching of features in monocrystalline wafer substrates and, more particularly, to a method of forming an etched feature which is connected to at least one orientation dependent etched feature without compromising the dimensional control inherent in an orientation dependent etching process.

BACKGROUND OF THE PRIOR ART

Orientation dependent etching (ODE) is a wet etching step which attacks different crystalline planes at different rates. As is well known in the art of orientation dependent etching, etchants such as potassium hydroxide, or TMAH (tetramethylammonium hydroxide), or EDP etch the (111) planes of silicon much slower (on the order of 100 times slower) than they etch other planes. A well-known case of interest, described in U.S. Pat. No. 3,765,969, is the etching of a monocrystalline silicon wafer having (100) orientation. There are four different orientations of (111) planes which intersect a given (100) plane. The intersection of a (111) plane and a (100) plane is a line in a [110] type direction. There are two different [110] directions contained within a (100) plane. They are denoted as [011] and [01-1] and are perpendicular to one another. Thus, if a monocrystalline silicon substrate having (100) orientation is covered with a layer, such as oxide or nitride which is resistant to etching by KOH or TMAH, but is patterned to expose a rectangle of bare silicon, where the sides of the rectangles are parallel to [110] type directions, and the substrate is exposed to an etchant such as KOH or TMAH, then a pit will be etched in the exposed silicon rectangle. If the etch is allowed to proceed to completion, then the pit will have four sloping sides, each side being a different (111) plane. Because the (111) planes etch so slowly, the process is said to be self-terminating. The shape and dimensions of the pit are very predictable and reproducible, being relatively insensitive to the etch bath conditions or etching duration, as long as the etching has been allowed to proceed to completion. If the length and width of the rectangle of exposed silicon were L and W respectively, and if L=W, then the four (111) planes would meet at a point, and the pit would be pyramid shaped. The (111) planes are at a 54.7 degree angle with respect to the (100) surface. The depth H of the pit is half the square root of 2 times the width, that is, H=0.707 W. If L>W, then the maximum depth H is still 0.707 W and the shape of the pit is a V groove with sloped sides and sloped ends. The length of the region of maximum depth of the pit is L−W. Of course, if the thickness of the substrate is less than 0.707 W, and if the etch is allowed to proceed to completion, then a hole will be etched through the substrate.

One constraint of orientation dependent etching of self-terminated pits in (100) wafers is that, if etched to completion, they will intersect the wafer surface as a rectangle whose sides are parallel to [110] type directions. Arbitrary shapes are not allowed. FIG. 1A is a top view of a self-terminated orientation dependent etched pit 11 having length L and width W in a (100) wafer. Region 12 has been covered by masking layer, such as an oxide or a nitride, so that the (100) wafer surface was not exposed to the etchant. Region 13 is a rectangle with sides parallel to [110] directions. In region 13, the masking layer was removed prior to orientation dependent etching, so that the wafer surface was exposed. FIG. 1B is a cross-section of rectangular pyramid shaped pit 11 through line 1B-1B. Maximum depth of pit 11 is H=0.707 W.

FIG. 2 shows one example of what occurs if the exposed region 23 is not a rectangle with sides parallel to [110] type directions. As seen in the top view of FIG. 2A, all sides of the exposed region are parallel to [110] type directions, but the exposed region 23 has an abrupt change in width from W1 to W2, as if a wide rectangle having length L1 and a narrow rectangle having length L2 had been exposed end to end. Stated in another way, the exposed region 23 is a polygon with at least one convex corner 24. A convex corner is defined here as a region which bulges into the polygon. A convex corner has the property that if a line is drawn between adjacent sides of the corner, the line will lie outside the polygon. Line 25 in FIG. 2A is an example. There are two convex corners in FIG. 2A, but only convex corner 24 is labeled. FIG. 2B shows a top view of the resulting pit 21 if etched to completion. The masking layer has been removed for greater visibility of the etched pit 21. Etching continues at a rapid rate even under the masking layer 22, until the final shape is a rectangular pyramid having width W1, length L1+L2, maximum depth H=0.707 W1, and no convex corners.

FIG. 3 shows a second example of what occurs if the exposed region is not a rectangle. In this case, the exposed region 33 consists of two rectangles, each having sides parallel to [110] type directions, which intersect in a T. Exposed region 33 has two convex corners, one of which is labeled as 36. Line 37 is drawn between adjacent sides to the convex corner and lies outside exposed region 33. The length and width of rectangle 34 are L1 and W1, and the length and width of rectangle 35 are L2 and W2, where L2>L1. FIG. 3B shows a top view of the resulting pit 31 if etched to completion. Etching will continue at a rapid rate even under the masking layer 32 until the final shape is a rectangular pyramid having length W1+L2, width L1, maximum depth H=0.707 L1, and no convex corners.

Because of the precision and reproducibility of orientation dependent etched features in (100) wafers, a variety of applications have been developed. One family of applications is related to the formation of fluid passageways, including fluid inlet holes, fluid filters, fluid manifolds, fluid flow restrictors, and individual fluid channels. It is frequently desired to join one or more of such fluid passageway components in a fluidic device, such as an ink jet printhead. However, due to the constraints of orientation dependent etching described above, such different components typically cannot be joined together by means of orientation dependent etching to completion.

U.S. Pat. No. 4,601,777 discusses various processes for fabricating thermal ink jet printheads. FIG. 4 shows a top view of a group of ink channels 41 which are desired to be fluidically connected to ink manifold 42. In this case the V-shaped grooves which will comprise channels 41 are formed by a self-terminating orientation dependent etching process, which is preferred because it is desired to precisely control the channel dimensions. The ink manifold 42 is formed by a timed orientation dependent etching process. The grooves forming the channels are formed close to the manifold, but not connected to it in the initial etching process. A narrow region 43 initially isolates the channel grooves from the manifold. Two alternatives are disclosed for making fluidic connection between the manifold 42 and the channels 41. The first alternative is to isotropically etch to undercut the nitride mask in the narrow isolation region 43, followed by a brief orientation dependent etch to complete the opening of the channels to the manifold. A disadvantage of this approach is that during the timed orientation dependent etch to join the channels to the manifold, the walls 44 between channels 41 nearest to the ends of the channels closest to the manifold 42 etch at a rapid rate, so that the precision and reproducibility of the channel dimensions are compromised somewhat. A second alternative described by U.S. Pat. No. 4,601,777 is to remove the narrow region 43 by a subsequent dicing operation. A disadvantage of this alternative, which is disclosed in the patent, is that the dicing operation also removes material which is not desired to be removed and which must be replaced in a subsequent sealing operation.

A second configuration of joining of fluidic passageways formed by orientation dependent etching is described in U.S. Pat. No. 4,639,748. In this case it is desired to join an orientation dependent etched fluid manifold to a particle filter comprised of a pattern of recesses which have been orientation dependent etched. The method of making the connection is to use an isotropic etch followed by an orientation dependent etch, similar to the first alternative described above for U.S. Pat. No. 4,601,777.

A third instance of joining of fluidic passageways formed by orientation dependent etching is described in U.S. Pat. No. 4,774,530. In this case it is desired to connect ink jet channels to an ink manifold. The channels and manifold are etched in an upper substrate with is aligned and mated to a lower substrate. On the lower substrate is a thick film layer which is patterned in such a way that fluidic connection is made between the channels and manifold. Such a thick film layer, however, is not always available in devices where it is desired to make passageways to connect orientation dependent etched features.

In addition to the forming of fluidic passageways, orientation dependent etched features are also used various other different types of applications. For example, the capability of forming precision V grooves by orientation dependent etching has been frequently used as a means for precision alignment of optical components, such as the end-to-end alignment of optical fibers, or the alignment of a laser to optical fibers.

Furthermore, orientation dependent etched features have been used in processes for fabrication of integrated circuit components, for example providing electrical isolation while minimizing parasitic capacitance (U.S. Pat. No. 4,685,198).

Orientation dependent etching is also frequently used in fabrication of a variety of microelectromechanical systems (or MEMS) devices.

Recognizing that orientation dependent etching has a wide range of applications, and that methods are desirable for forming a passageway or recess which is connected to one or more orientation dependent etched feature, this invention is directed toward such methods.

SUMMARY OF THE INVENTION

According to one aspect of the present invention, a method of etching a substrate comprises providing a substrate; coating a region of the substrate with a temporary material having properties that enable the temporary material to remain substantially intact during subsequent processing and enable the temporary material to be removed by a subsequent process that allows the substrate to remain substantially unaltered; removing a portion of the substrate to form a feature, at least some of the removed portion of the substrate overlapping at least a portion of the coated region of the substrate while allowing the temporary material substantially intact; and removing the temporary material while allowing the substrate to remain substantially unaltered.

According to another aspect of the present invention, an article includes a first feature having a first width formed from a self-terminated orientation dependent etching process. A second feature having a second width and a third feature are provided. The second feature connects the first feature and the third feature with the first width being greater than the second width.

According to another aspect of the present invention, an article includes a first feature having a first depth formed from a self-terminated orientation dependent etching process. A second feature having a second depth and a third feature are provided. The second feature connects the first feature and the third feature with the first depth being greater than the second depth.

BRIEF DESCRIPTION OF THE DRAWINGS

In the detailed description of the embodiments of the invention presented below, reference is made to the accompanying drawings, in which.

DETAILED DESCRIPTION OF THE INVENTION

The present description will be directed, in particular, to elements forming part of, or cooperating directly with, apparatus or processes of the present invention. It is to be understood that elements not specifically shown or described may take various forms well known to those skilled in the art.

FIGS. 5-11 illustrate a first embodiment of a method of forming an etched recess which is joined to at least one orientation dependent etched feature, without compromising the dimensional control inherent in orientation dependent etching. The general approach is to first etch the recess, and then coat it (and optionally fill it) with a temporary layer; then expose an overlapping region of substrate and etch it with an orientation dependent etch process; and then remove the temporary material from the etched recess feature.

Figure 5A:
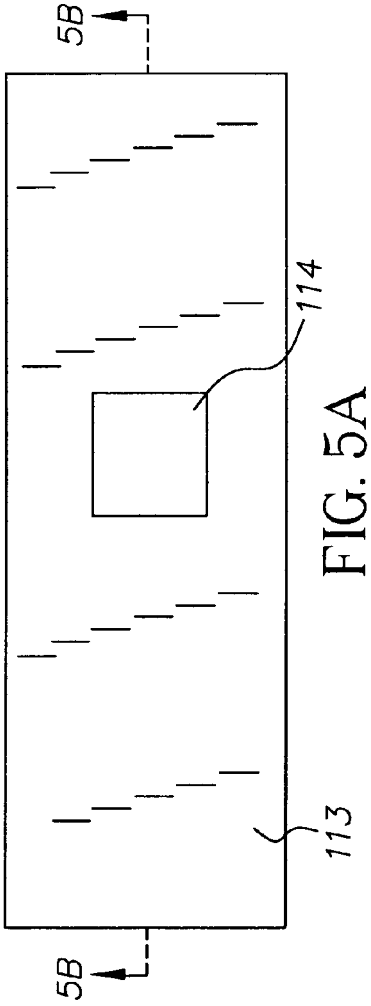
FIG. 5A shows a top view of a step in a first embodiment in which a mask layer on the substrate has been patterned to expose the substrate for etching a recess.
Figure 5B:
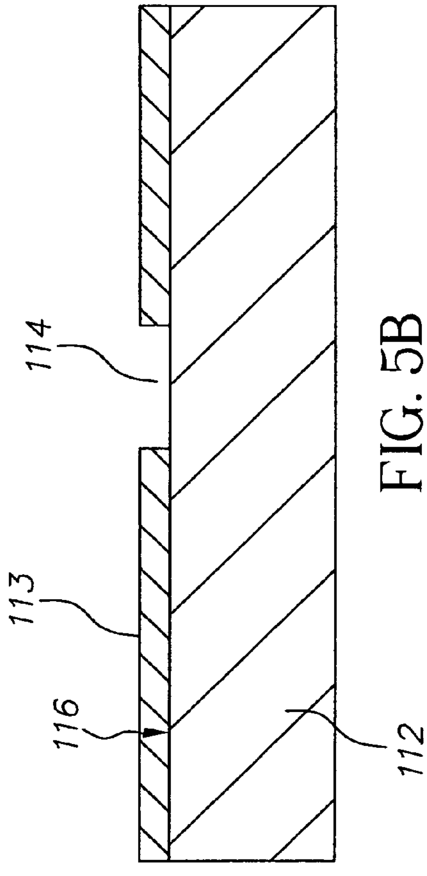
FIG. 5B shows a cross-sectional view of the substrate and patterned mask layer, as seen along the direction 5B-5B.

FIG. 5 shows a top view and a cross-sectional view of a (100) wafer substrate 112 having a top surface 116 upon which a masking layer 113 has been deposited and patterned to expose a region 114 of wafer surface. Note: region 114 is depicted as a rectangle, but it may be comprised of one or more contiguous or noncontiguous regions of somewhat arbitrary shape, including polygonal shapes or curved shapes. Masking layer 113 may be an oxide or nitride material for example.

Figure 1A:
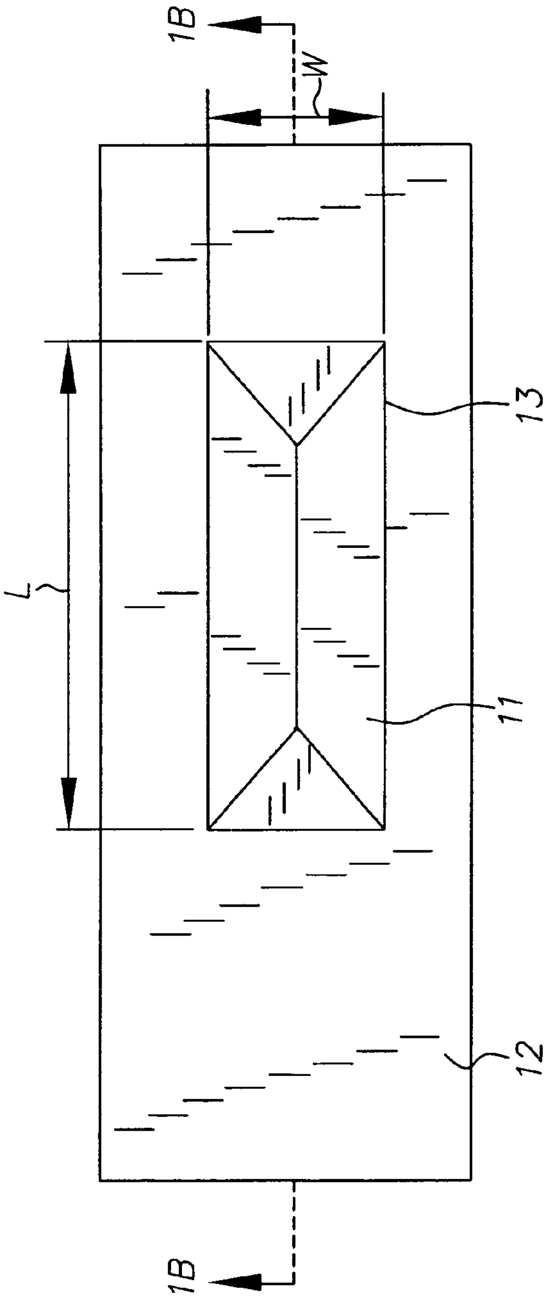
FIG. 1A is a top view of a self-terminated orientation dependent etched pit in a (100) wafer.
Figure 1B:
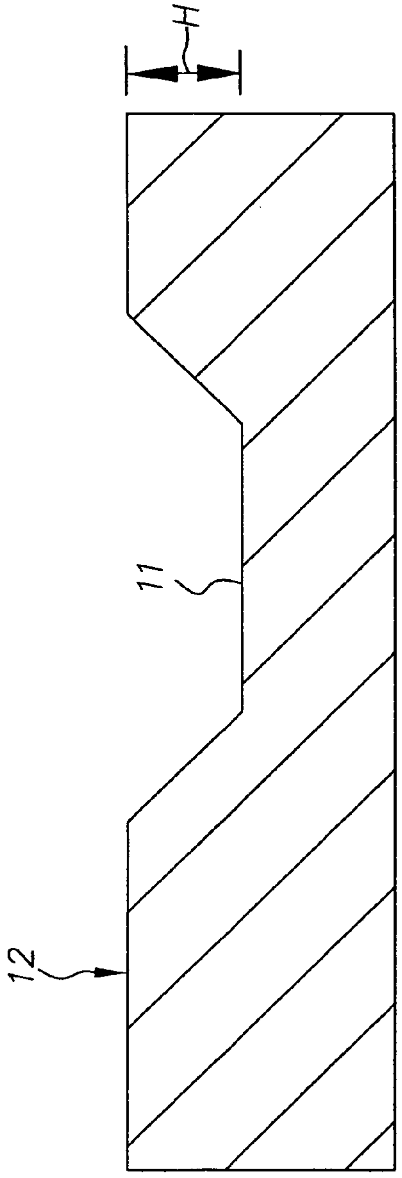
FIG. 1B is a cross-sectional view of the rectangular pyramid shaped pit of FIG. 1A, as seen along the direction 1B-1B.
Figure 2A:
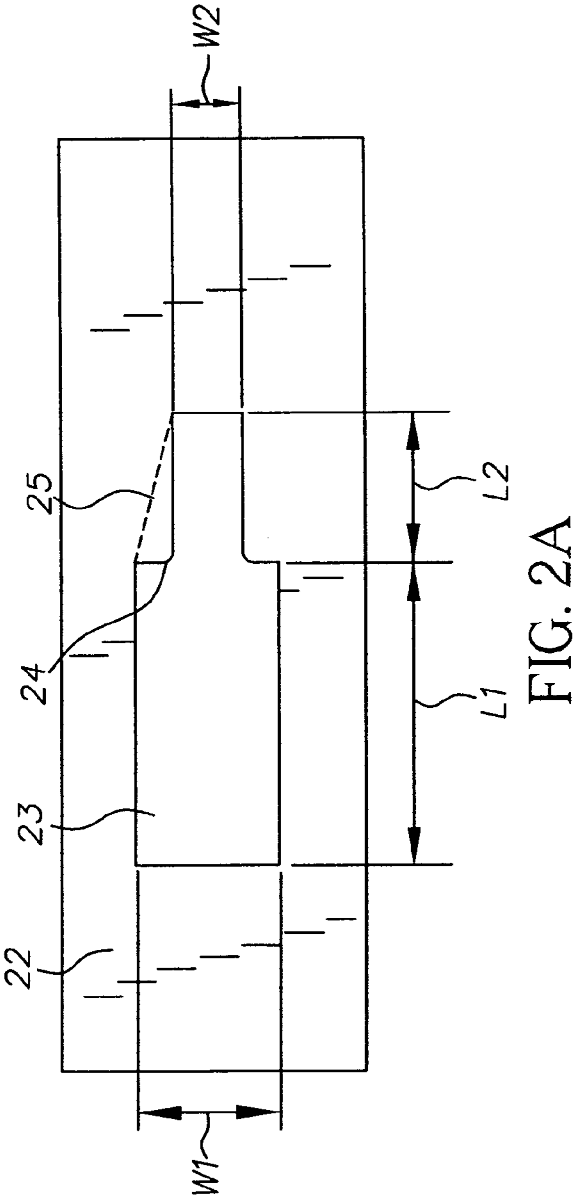
FIG. 2A is top view of a mask pattern on a (100) wafer where the exposed region is two rectangles of different width which are joined end to end.
Figure 2B:
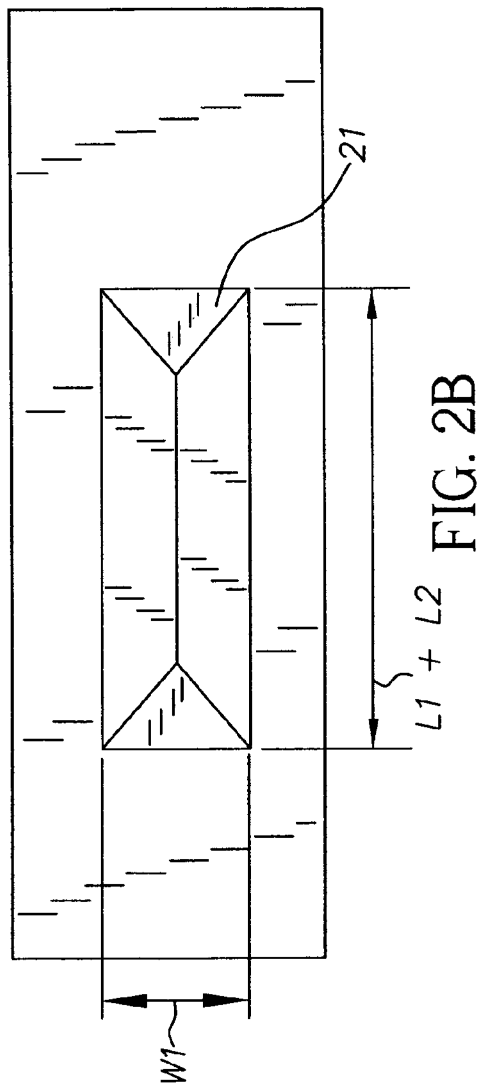
FIG. 2B is a top view of an orientation dependent etched pit where the etching was done to completion through the mask pattern of FIG. 2A.
Figure 3A:
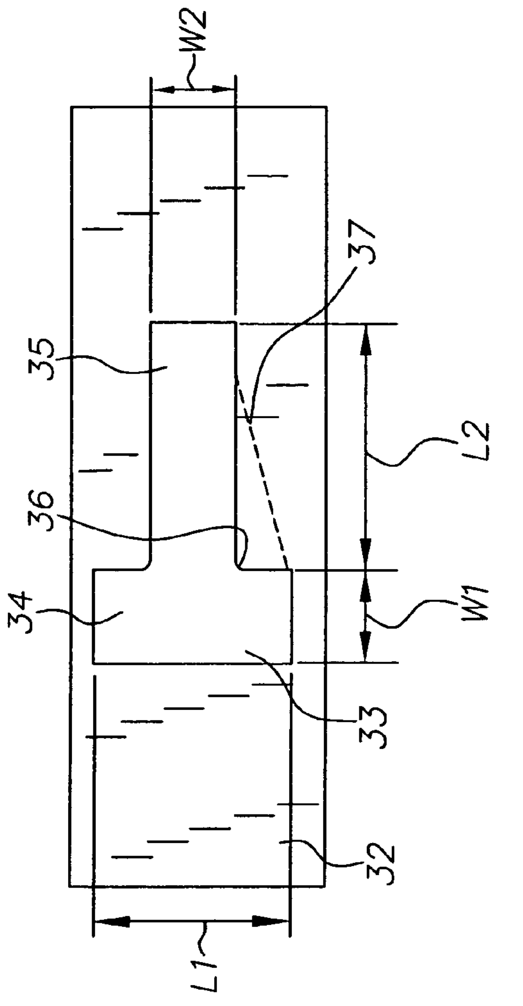
FIG. 3A is a top view of a mask pattern on a (100) wafer where the exposed region is two rectangles intersecting at a T.
Figure 3B:
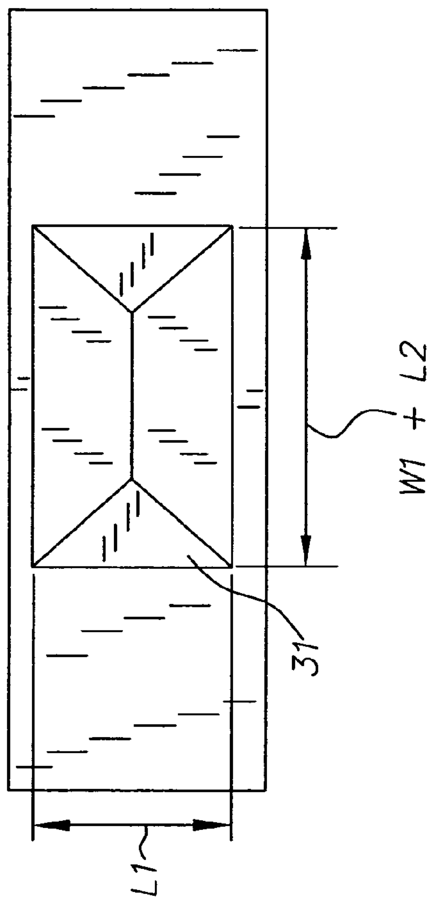
FIG. 3B is a top view of an orientation dependent etched pit where the etching was done to completion through the mask pattern of FIG. 3A.
Figure 4:
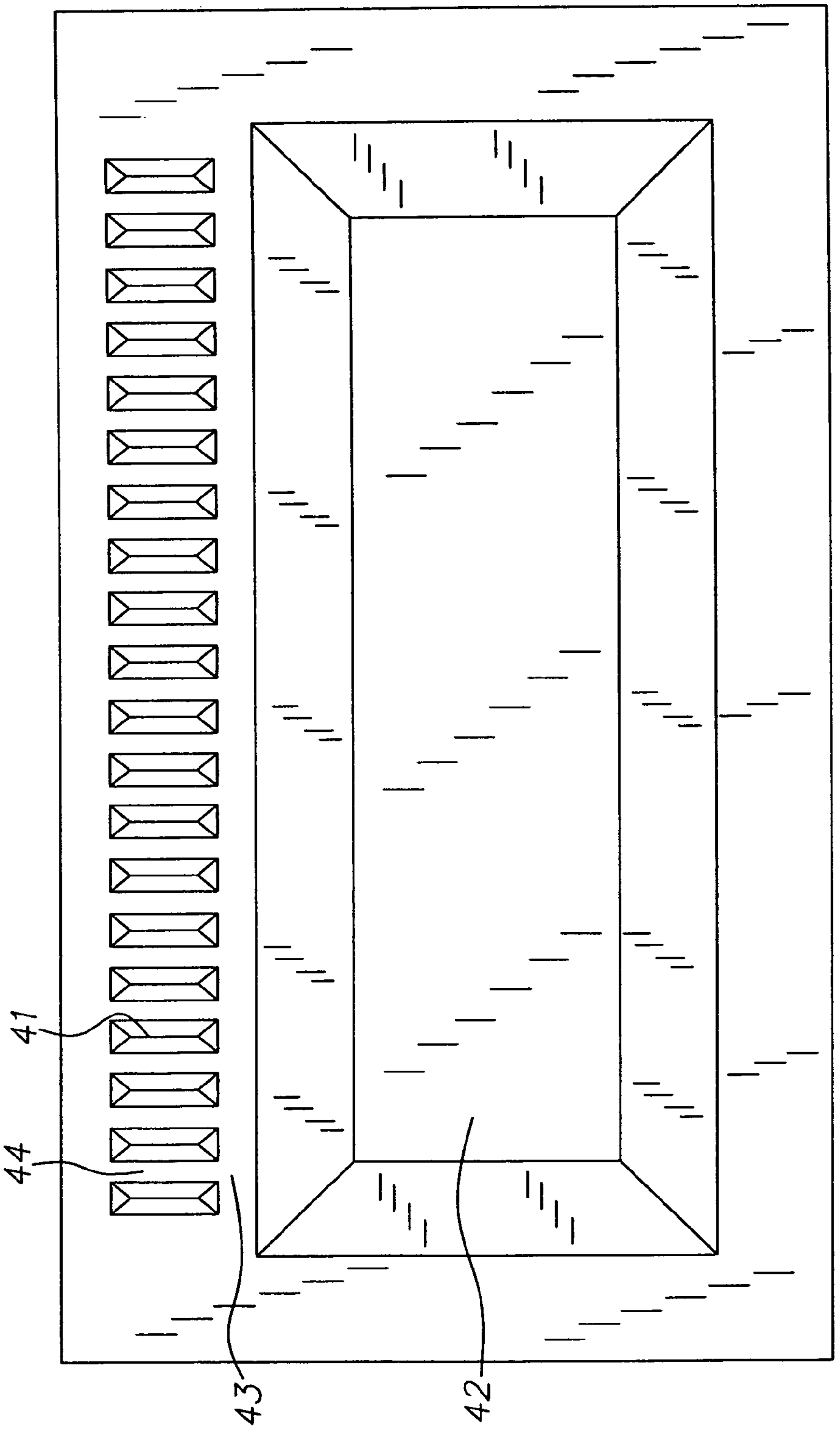
FIG. 4 is a top view of prior art application of orientation dependent etched ink jet channels adjacent to an orientation dependent etched manifold.
Figure 6A:
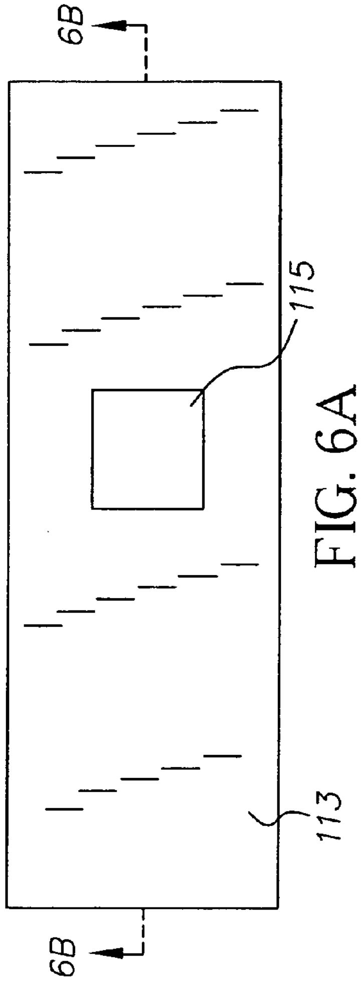
FIG. 6A shows a top view following the subsequent step of etching a recess by DRIE.
Figure 6B:
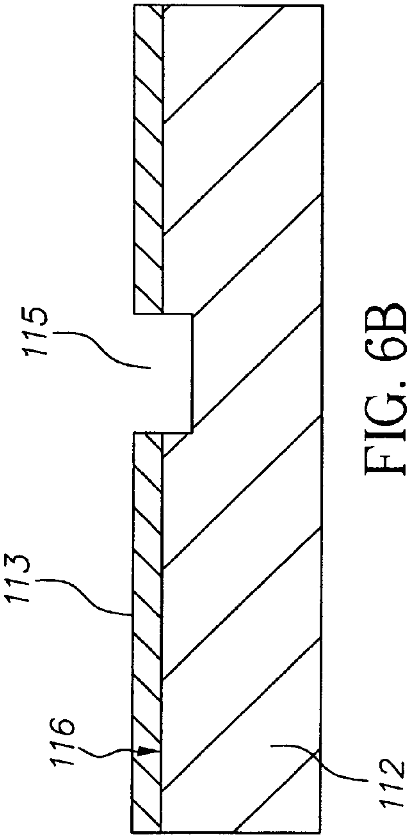
FIG. 6B shows a cross-sectional view of the substrate, etched recess and patterned mask layer, as seen along the direction 6B-6B.

FIG. 6 shows a top view and a cross-sectional view of the same region, after a recess 115 has been etched at location 114. The lateral shape of the recessed feature will be determined largely by the patterned shape of region 114, while the cross-sectional shape will be dependent largely on the etch process used. A deep reactive ion etch process (DRIE) will provide a recess with vertical sidewalls. An isotropic etch process will provide a more rounded structure. An orientation dependent etched process will provide an angled pit, similar to that shown in FIG. 1. In FIG. 6, the recessed feature is depicted as having vertical sidewalls characteristic of DRIE processing.

Figure 7A:
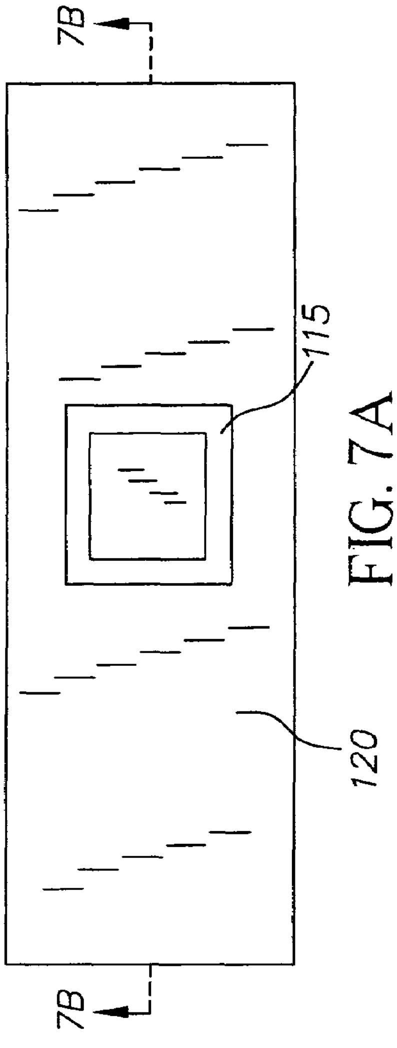
FIG. 7A shows a top view following the subsequent step of coating the substrate surface with a temporary material.
Figure 7B:
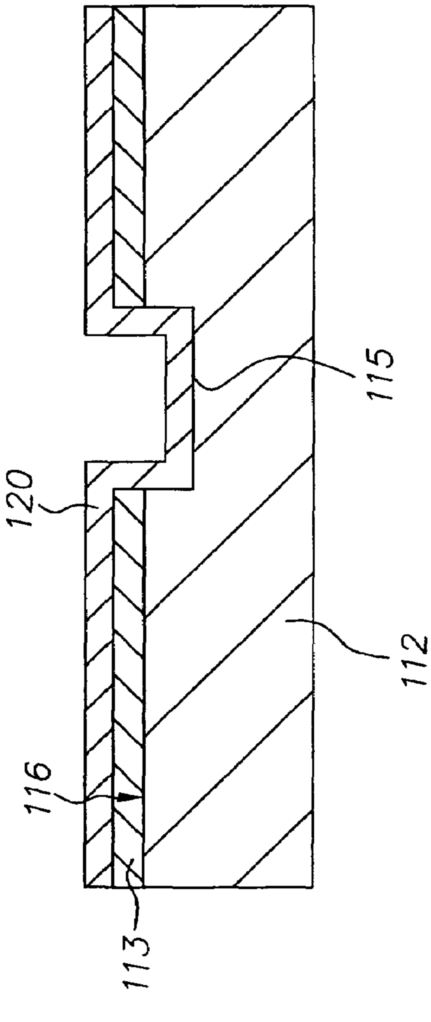
FIG. 7B shows a cross-sectional view of the substrate, etched recess, temporary layer and patterned mask layer, as seen along the direction 7B-7B.

FIG. 7 shows a top view and a cross-sectional view of the same region, after the surface has been coated with a temporary material 120. In FIG. 7 the thickness of the temporary coating is sketched as being less than the depth of the recess 115, so that the top of layer 120 in the recess 115 is lower than the wafer surface 116. However, optionally the thickness of temporary coating may be equal to or greater than the depth of the recess 115. The temporary material may, for example, be comprised of a blanket coated layer of TEOS which has been deposited by plasma-enhanced chemical vapor deposition. A second example of temporary material is a glass layer which is spun on and then heat treated to form a blanket coating. Although FIG. 7 shows the temporary material 120 as being coated over the masking layer 113, it is also possible to remove the masking layer 113 prior to coating the wafer 112 with the temporary material 120. Optionally, a nitride masking layer 113 may be used as an etch stop in a subsequent step of chemical mechanical polishing, and then removed.

Figure 8A:
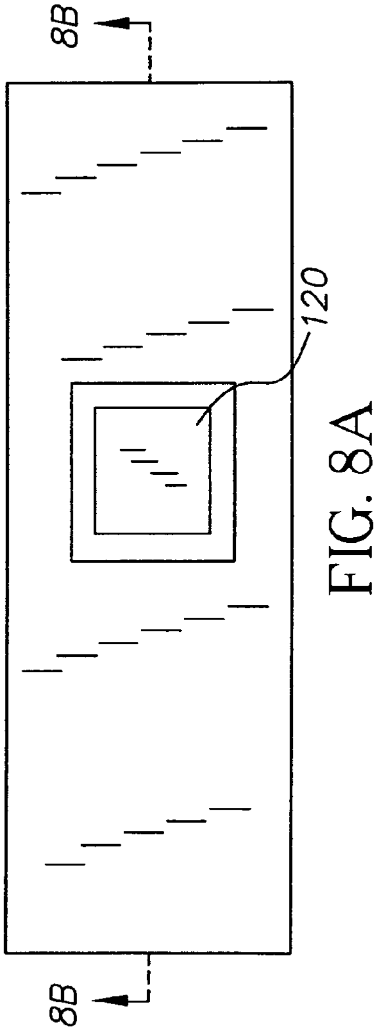
FIG. 8A shows a top view following the subsequent step of polishing the surface to remove the temporary material except in the recess.
Figure 8B:
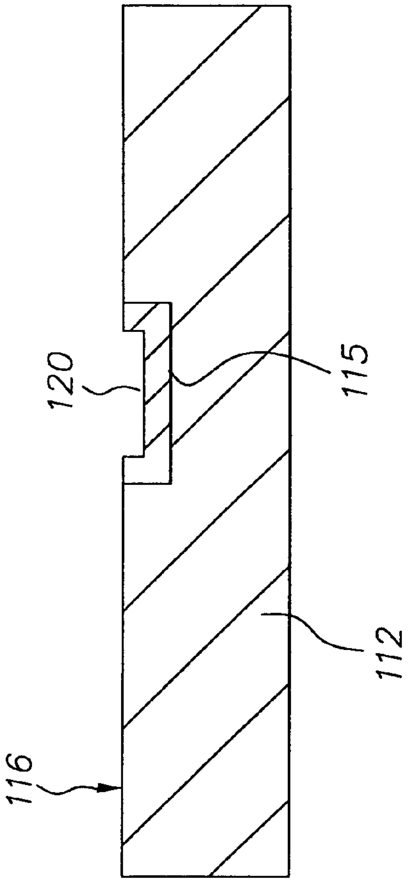
FIG. 8B shows a cross-sectional view of the substrate, etched recess, and temporary layer in the recess, as seen along the direction 8B-8B.

FIG. 8 shows a top view and a cross-sectional view of the same region, after the surface has been polished, for example by a chemical mechanical polishing process, to expose wafer substrate surface 116. The temporary material 120 still covers the floor and sidewalls of the recess 115. If the temporary material 120 had been deposited in a thickness greater than the depth of the recess 115, the step of polishing would have resulted in the top of the temporary material 120 being at the same level as the top of the substrate 116.

Figure 9A:
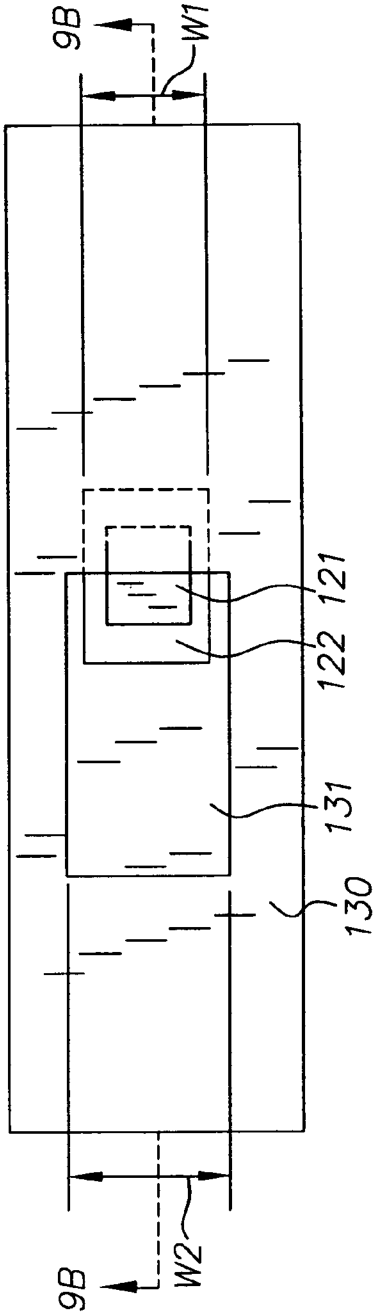
FIG. 9A shows a top view following the subsequent step of patterning a masking layer such that the exposed region at least partly overlaps the coated layer in the recess.
Figure 9B:
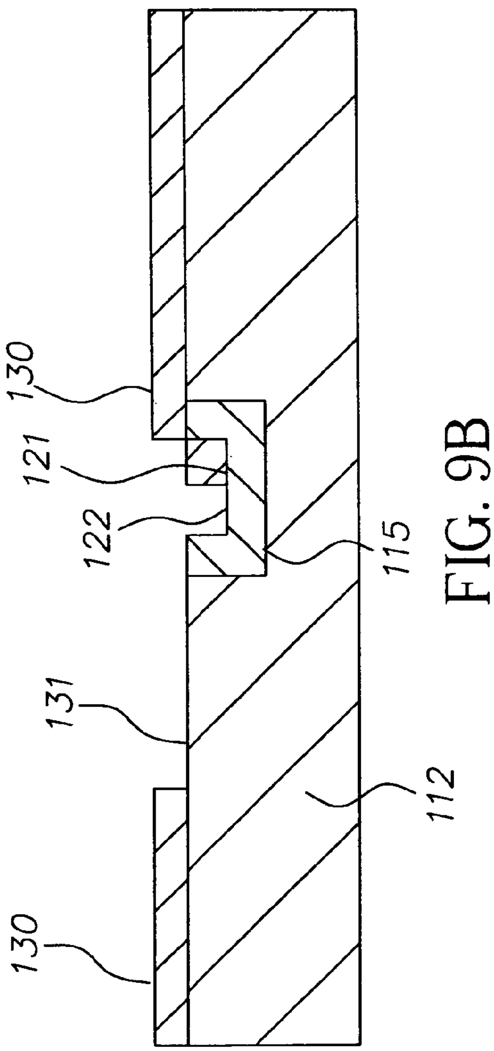
FIG. 9B shows a cross-sectional view of the substrate, etched recess, temporary layer in the recess, and patterned masking layer, as seen along the direction 9B-9B.

FIG. 9 shows a top view and a cross-sectional view of the same region, after a masking layer 130 has been deposited and patterned to expose a rectangular area 131 having its sides parallel to [110] type directions. Exposed rectangular area 131 overlaps the coated recess 115. In other words, portion 122 of temporary material 120 is enclosed within exposed rectangular area 131, while portion 121 of temporary material 120 is outside of rectangular area 131, so that portion 121 is coated with masking layer 130. In addition, width W2 of the exposed rectangular area 131 is greater than width W1 of the coated recess 115 in the area where these two overlap one another.

Figure 10A:
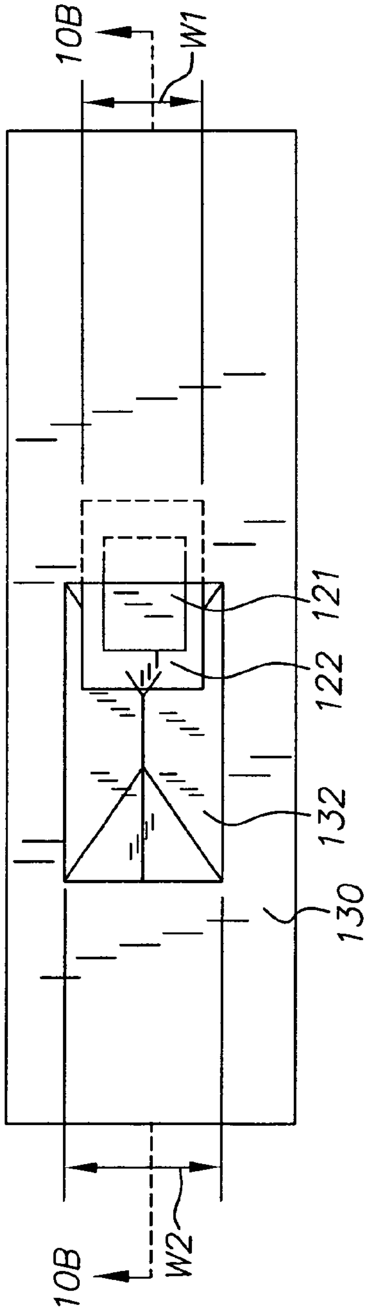
FIG. 10A shows a top view following the subsequent step of orientation dependent etching.
Figure 10B:
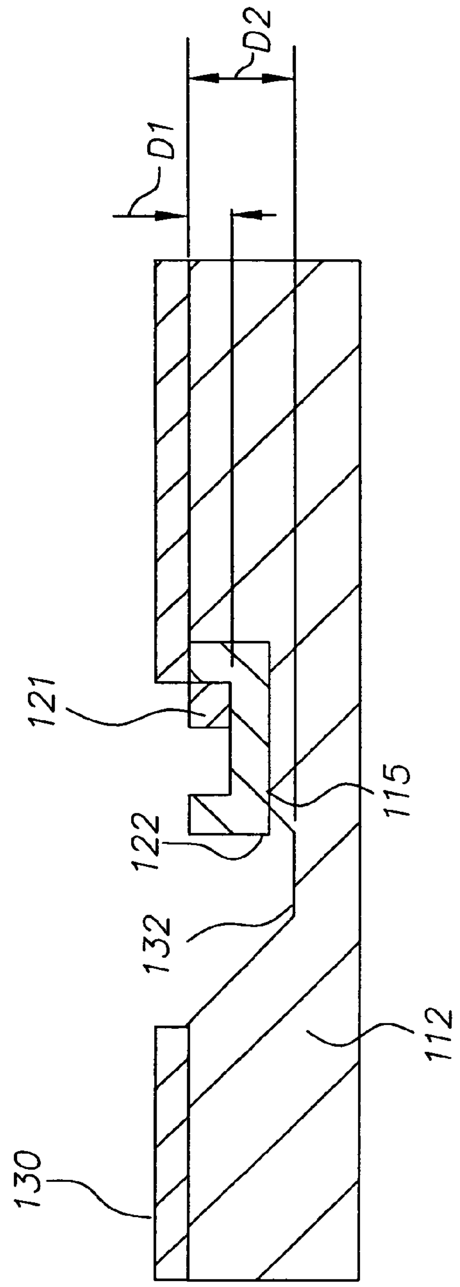
FIG. 10B shows a cross-sectional view of the substrate, etched recess, orientation dependent etched feature, temporary layer which is in the recess and which cantilevers over the orientation dependent etched feature, and patterned masking layer, as seen along the direction 10B-10B.

FIG. 10 shows a top view and a cross-sectional view of the same region, after orientation dependent etching to form feature 132. Feature 132 and coated recess 115 have been designed with respect to one another so that feature 132 is both wider and deeper than coated recess 115 in the area where they overlap one another. As a result, if orientation dependent etching is allowed to proceed to completion, feature 132 will continue to etch below coated recess 115, so that portion 122 of temporary material is left extending partially over feature 132 in cantilever fashion.

Figure 11A:
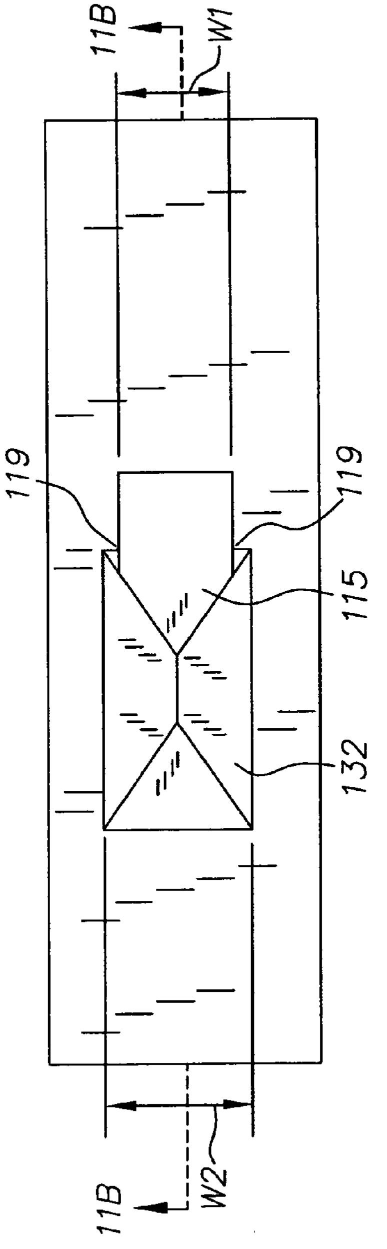
FIG. 11A shows a top view following the subsequent step of removing the temporary layer and the patterned mask layer.
Figure 11B:
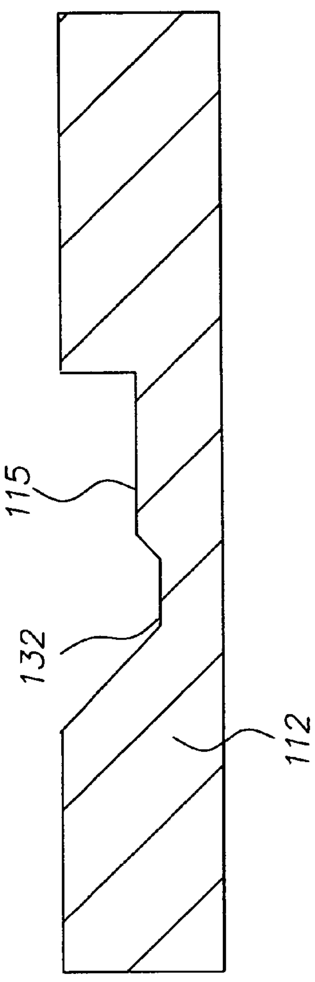
FIG. 11B shows a cross-sectional view of the substrate, the orientation dependent etched feature and the recess which is connected to it, as seen along the direction 11B-11B.

FIG. 11 shows a top view and a cross-sectional view of the same region, after the masking layer 130 and temporary material 120 (portion 121 as well as portion 122) have been removed. If masking layer 130 is an oxide, it may be removed at the same time as temporary material 120 by using a buffered solution of HF. Note that the composite etched region, comprised of the orientation dependent etched feature 132 and the formerly coated recess 115, has two convex corners 119, each of which is at the point of connection between feature 132 and recess 115. Further note that the precise dimensions (width, depth and length) and shape of feature 132 (provided by the self-terminated orientation dependent etch process) have not been compromised in providing connecting recess 115.

Figure 12A:
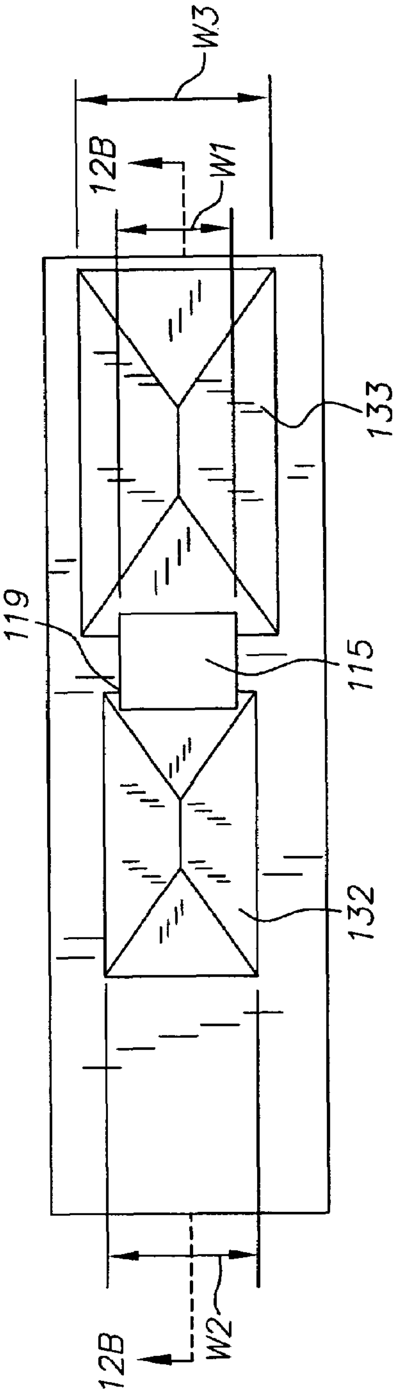
FIG. 12A shows a top view of a second embodiment in which the recess connects orientation dependent etched features at both ends.
Figure 12B:
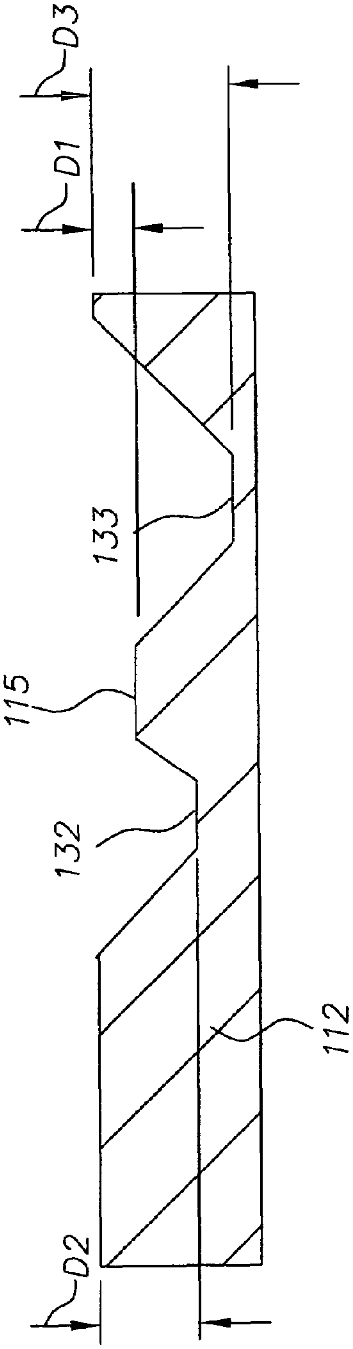
FIG. 12B shows a cross-sectional view, as seen along direction 12B-12B.

A second embodiment is shown in FIG. 12. In this case the method is the same as that described with reference to FIGS. 5-11. At the step corresponding to FIG. 9, regions which do not overlap one another in the masking layer have been made to overlap at each end of the coated recess 115. In the subsequent orientation dependent etching step, (corresponding to FIG. 10) temporary material 120 cantilevers over orientation dependent etched features at each end. Finally, when temporary material 120 is removed, the composite etched region shown in FIG. 12 results. In this particular case, orientation dependent etched feature 133 is shown as wider and deeper than orientation dependent etched feature 132. Both features 132 and 133 are wider and deeper than connecting recess 115.

Figure 13A:
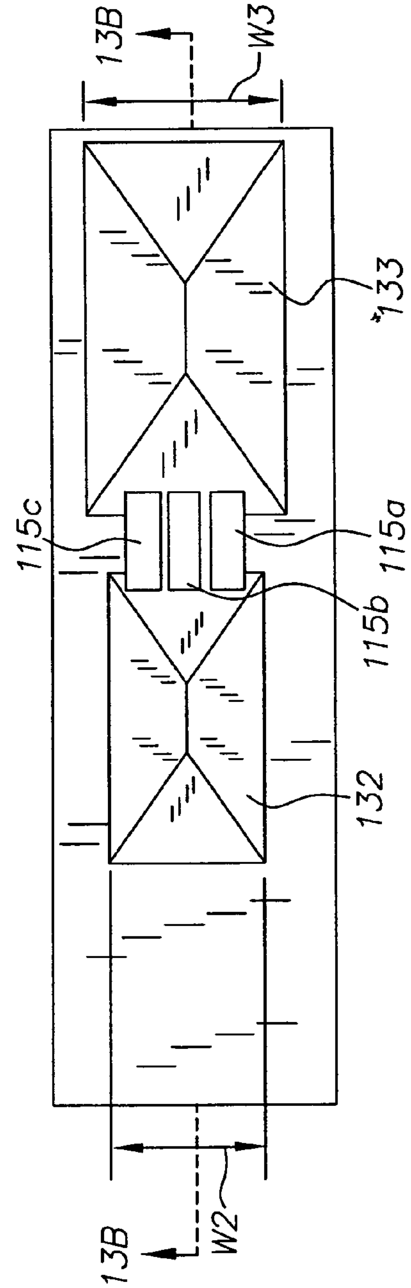
FIG. 13A shows a top view of a third embodiment in which a plurality of recess connects orientation dependent etched features at both ends.
Figure 13B:
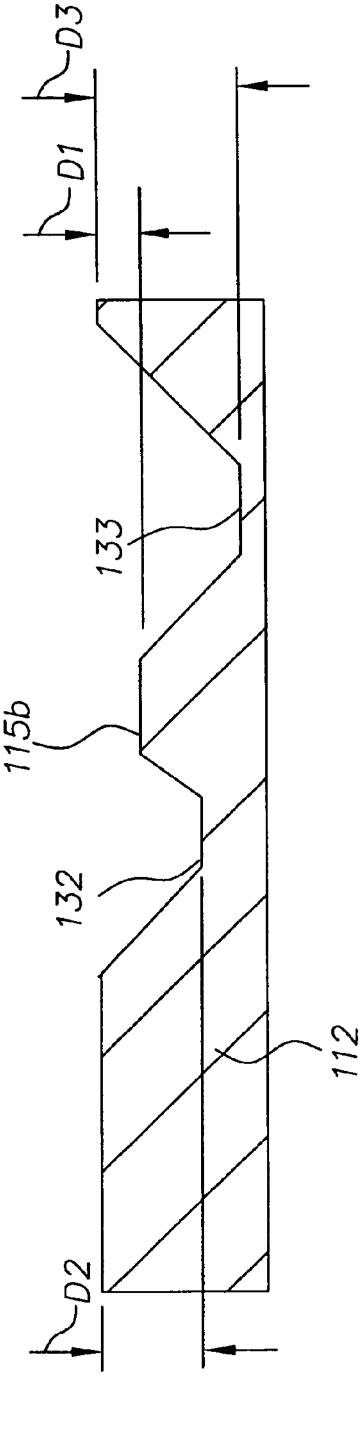
FIG. 13B shows a cross-sectional view, as seen along direction 13B-13B.

A third embodiment is shown in FIG. 13. In this case the method is again the same as that described with reference to FIGS. 5-11. At the step corresponding to FIG. 5, the mask pattern for the etched recess was patterned to expose a plurality of recesses 115*a*, 115*b* and 115*c*. Similar to FIG. 12, orientation dependent etched features 132 and 133 are connected by recesses.

Figure 14A:
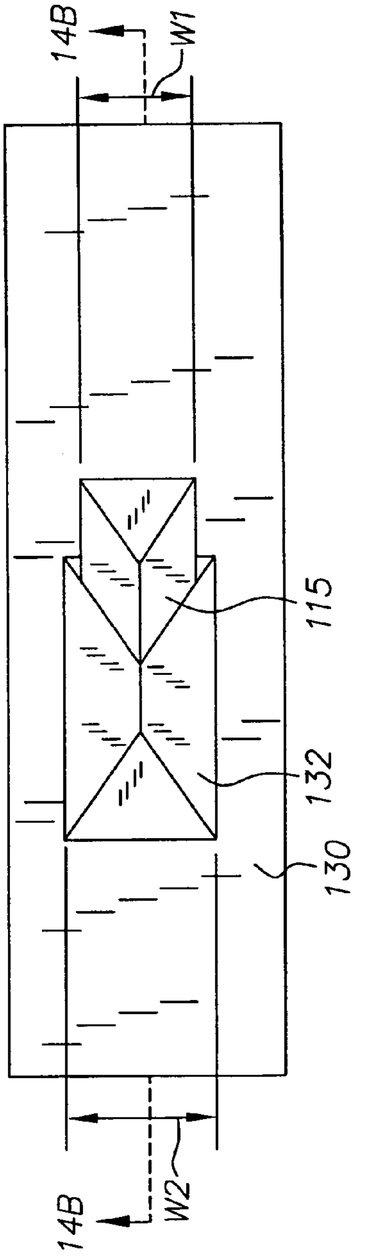
FIG. 14A shows a top view of a fourth embodiment in which the recess is formed by orientation dependent etching.
Figure 14B:
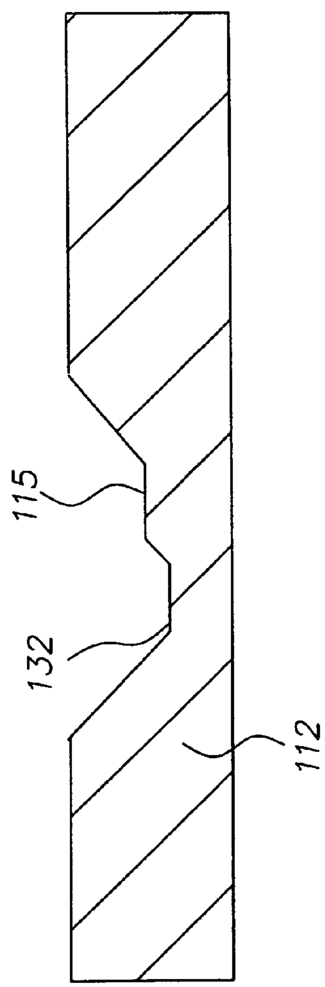
FIG. 14B shows a cross-sectional view, as seen along direction 14B-14B.

Although FIGS. 1-13 have shown the recess 115 with vertical sidewalls, consistent with a DRIE process, other types of etching may be used to form the recess. FIG. 14 shows the case where orientation dependent etching has been used to form the recess in the process sequence step which is similar to FIG. 6. This is an interesting case in that two orientation dependent etched features are made to connect directly end to end without compromising the width or depth of either feature.

Figure 15A:
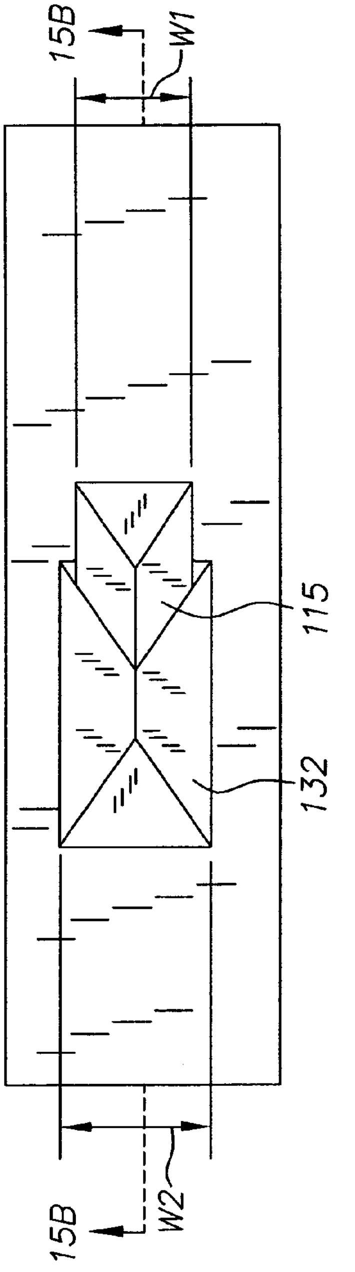
FIG. 15A shows a top view of a fifth embodiment in which the recess is formed by isotropic etching.
Figure 15B:
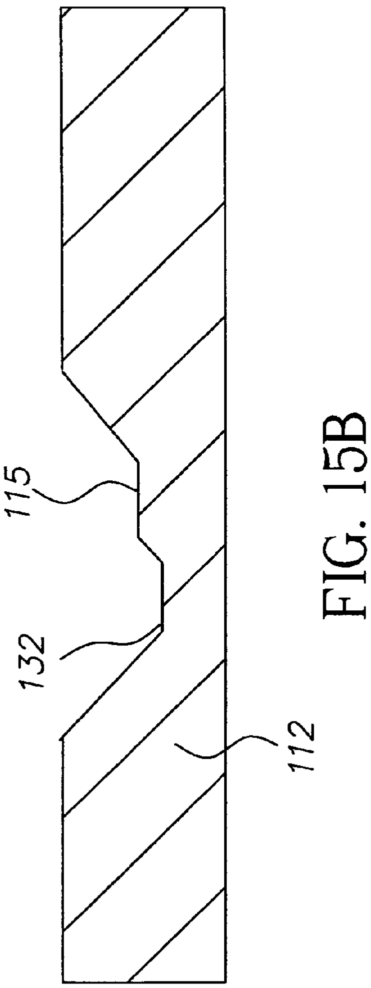
FIG. 15B shows a cross-sectional view, as seen along direction 15B-15B.

FIG. 15 shows the case where the recess has been formed by using isotropic etching in the process sequence step which is similar to FIG. 6.

The embodiments discussed thus far have been described in the context of connecting a recess to an orientation dependent etched feature which is at the top surface of the substrate. The next embodiment will describe the connection of a recess to an orientation dependent etched feature where the feature and the recess are covered by a layer which forms a roof over them. Such a structure is useful as a fluid chamber and fluid passageway in a microfluidic device, such as an ink jet printhead. Copending U.S. patent application Ser. No. 10/911,186, entitled A Fluid Ejector Having An Anisotropic Surface Chamber Etch, describes such a microfluidic device in greater detail.

FIGS. 16-22 illustrate an embodiment for forming a constriction in a fluid path between the fluid delivery channel and the nozzle of a fluid ejecting device. In this embodiment, the constriction is formed by connecting an orientation dependent etched fluid chamber and an orientation dependent etched impedance channel by means of a previously formed recess, said recess having a temporary material removed from it after the orientation dependent etching of the fluid chamber and the impedance channel is completed.

Figure 16A:
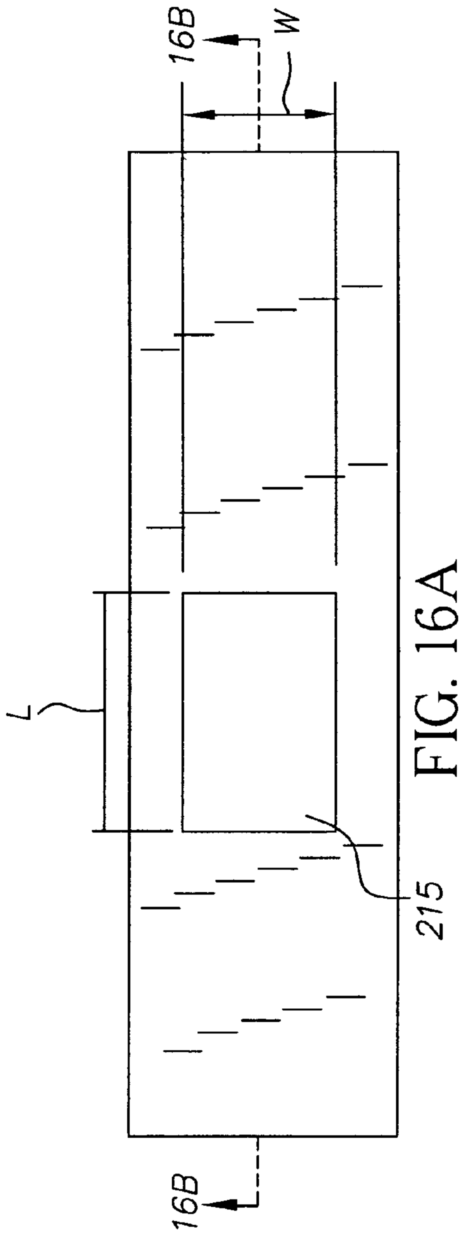
FIG. 16A shows a top view of a step of forming a recess in a surface of a substrate.
Figure 16B:
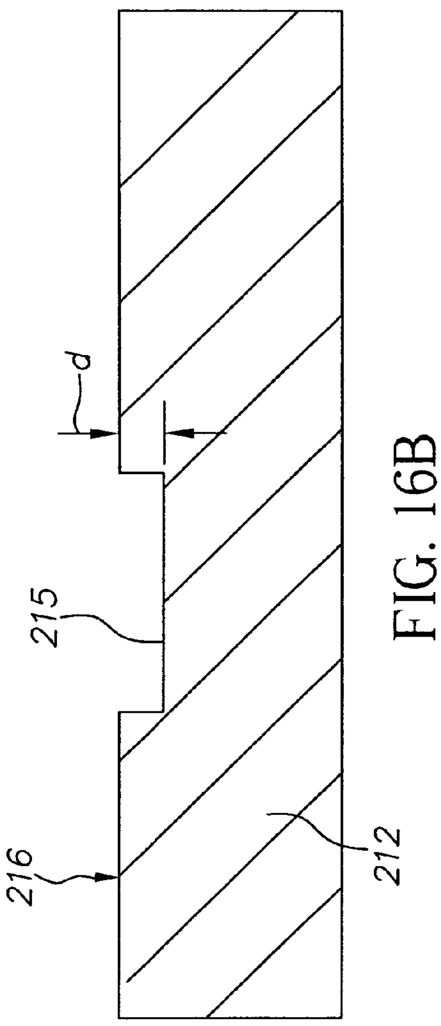
FIG. 16B shows a cross-sectional view, as seen along direction 16B-16B.

FIG. 16 shows the first step of etching a recess 215 into first surface 216 of (100) orientation silicon substrate 212. The recess 215 may be etched by a variety of isotropic or anisotropic means. However, in this embodiment, it is shown, for example, to be etched by reactive ion etching. This recess has lateral dimensions l and w, and a depth d.

Figure 17A:
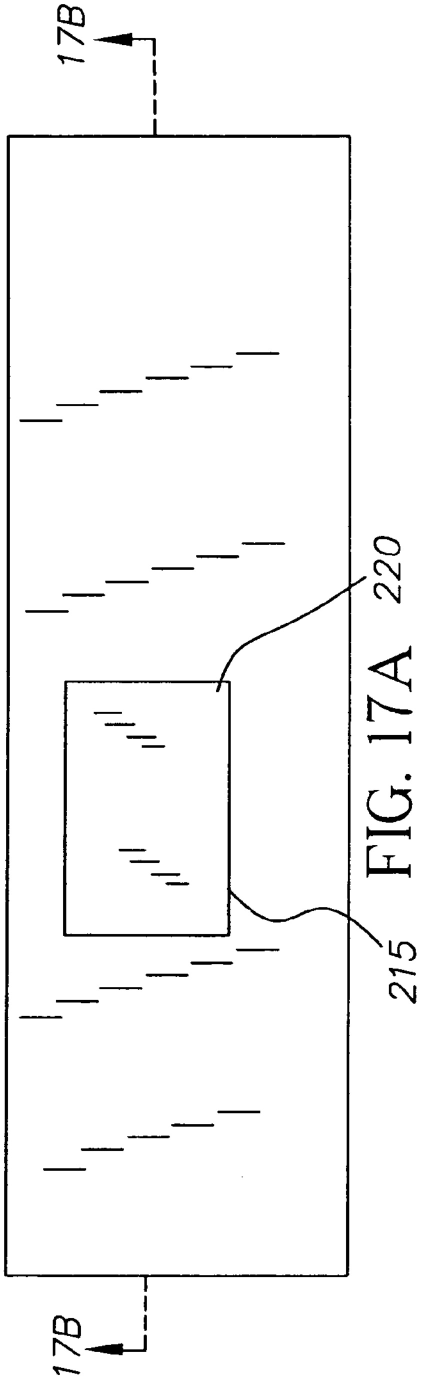
FIG. 17A shows a top view of a subsequent step of filling the recess with a temporary material.
Figure 17B:
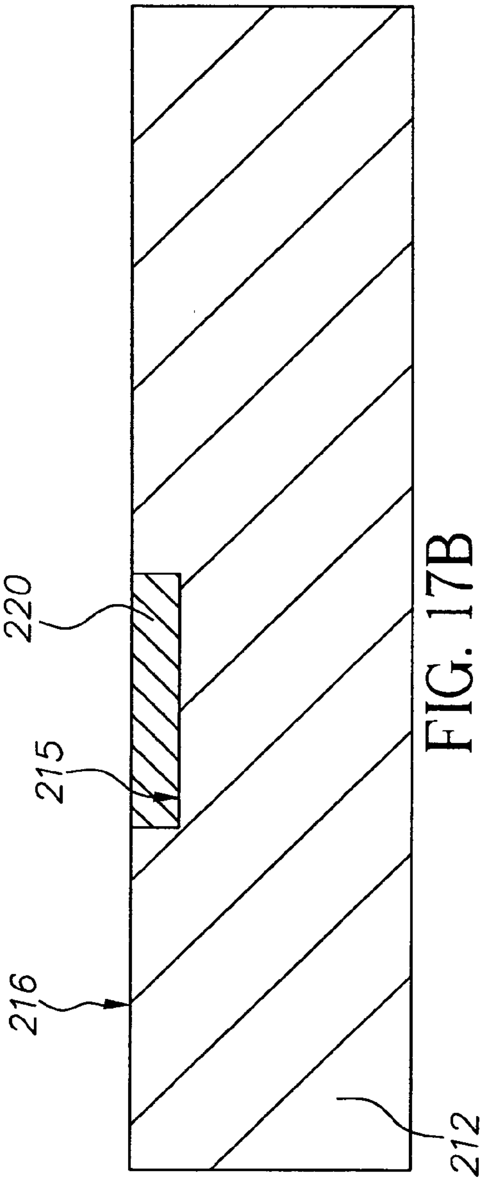
FIG. 17B shows a cross-sectional view, as seen along direction 17B-17B.

FIG. 17 shows recess 215 substantially filled with temporary material 220 having the following properties: a) it must be capable of filling the recess 215; b) it must be able to withstand the subsequent processing steps; c) it must be etched slowly or not at all by the etchant used to etch the temporary material above the fluid chamber; d) it must be etched slowly or not at all by the ODE etchant used in the fluid chamber etch step; and e) it must be removable by an etch process which does not substantially attack exposed silicon. Examples of such a material are TEOS or glass. In FIG. 17, the top of the temporary recess-filling material 220 is shown to be at the same level as the first surface 216 of the silicon substrate. The excess temporary material 220 which may have been deposited on surface 216 has been removed, by steps which may include chemical mechanical polishing.

Figure 18A:
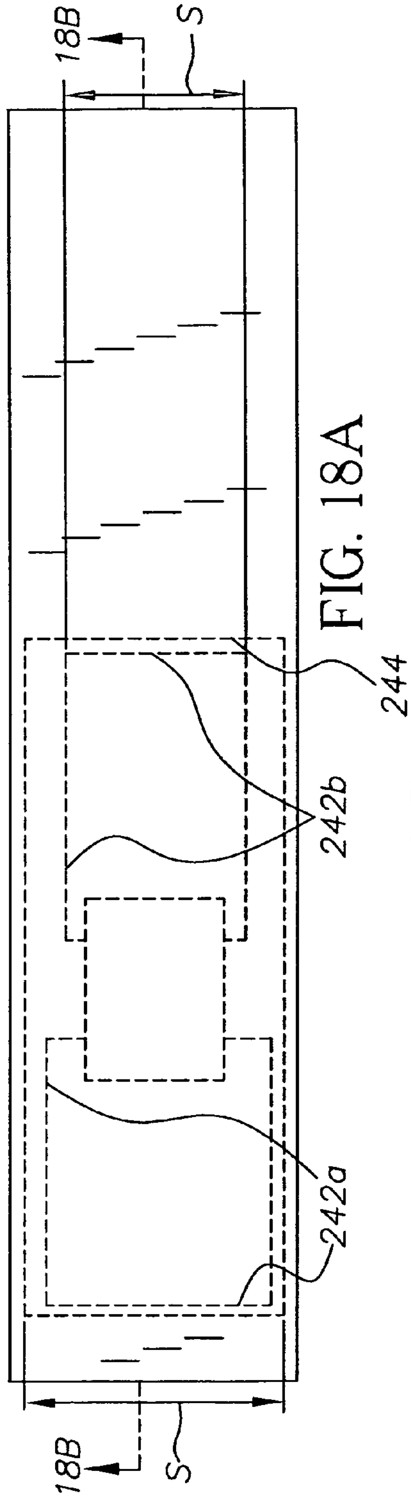
FIG. 18A shows a top view of a multilayer stack over the filled recess.
Figure 18B:
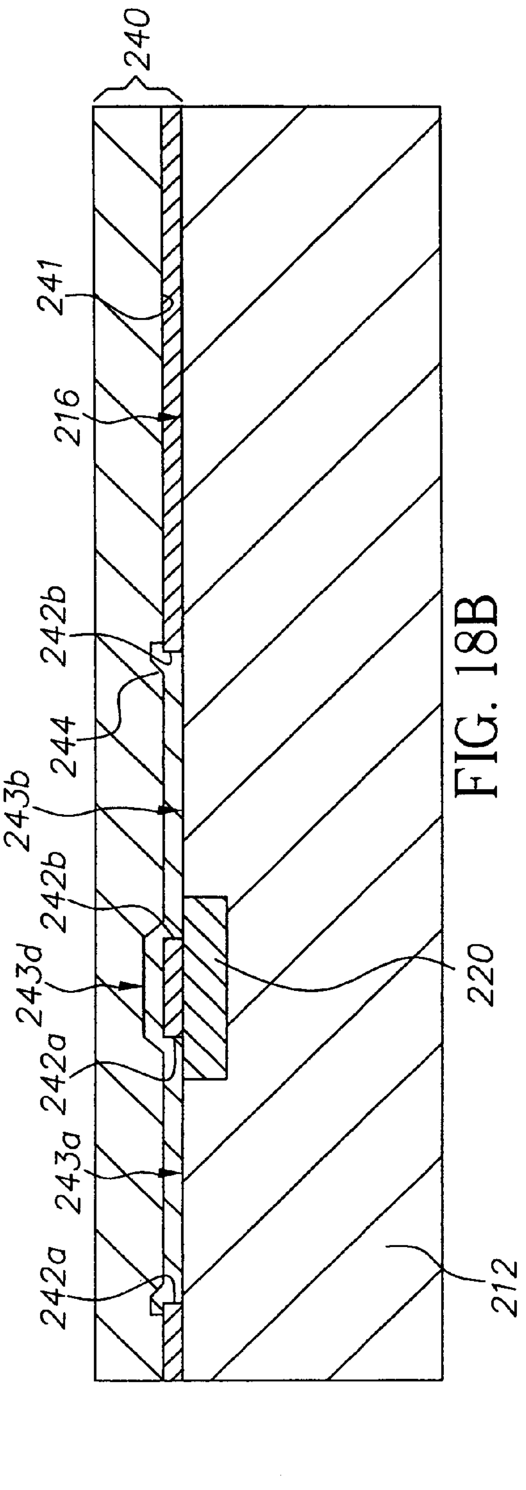
FIG. 18B shows a cross-sectional view, as seen along direction 18B-18B.

FIG. 18 shows the result of processing steps for a multilayer stack 240 over the recess filled with temporary material 220. The multilayer stack 240 in the vicinity of the fluid chamber also serves as a nozzle plate. Containing several levels of metals, oxide and/or nitride insulating layers, multilayer stack 240 is typically on the order of 5 microns thick. The lowest layer of the multilayer stack 240, formed directly on silicon surface 216 is an oxide or nitride layer 241. Hereinafter layer 241 will be referred to as an oxide layer. Layer 241 has the property that it may be differentially etched with respect to the silicon substrate in the etch step that will form the fluid chamber. As part of the processing steps for the multilayer stack 240, a region 242*a* of oxide is removed, corresponding to the subsequent location of the fluid chamber, and a region 242*b* of oxide is removed, corresponding to the subsequent location of the impedance channel. Layer 243 is a sacrificial layer which is deposited over the oxide layer 241, and then which is patterned so that the remaining sacrificial layer material 243*a* is slightly larger than the window 242*a* in the oxide layer 241, and remaining sacrificial material 243*b* is slightly larger than window 243*a* in the oxide layer 241. In other words, there is a small region of overlap 244, on the order of 1 micron, where the sacrificial layer 243 is on top of oxide layer 241 at the extreme ends of the fluid chamber and the impedance channel. Sacrificial layer 243 may be one of a variety of materials. A particular material of interest as a sacrificial layer 243 is polycrystalline silicon, or polysilicon. The patterned sacrificial layer 243 remains in place during the remainder of the processing of multilayer stack 240, but is removed later during the formation of the fluid chamber.

Figure 19A:
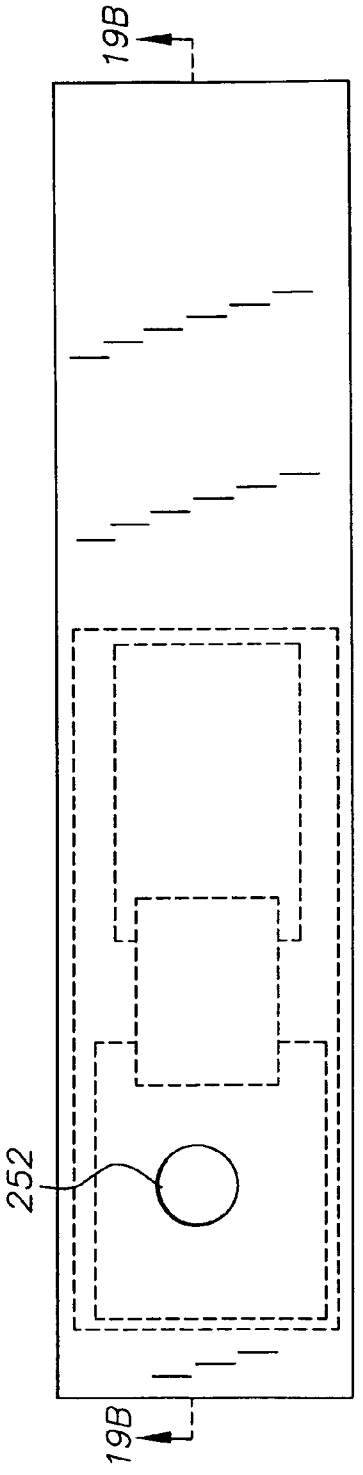
FIG. 19A shows a top view after a subsequent step of forming a nozzle hole through the multistack layer.
Figure 19B:
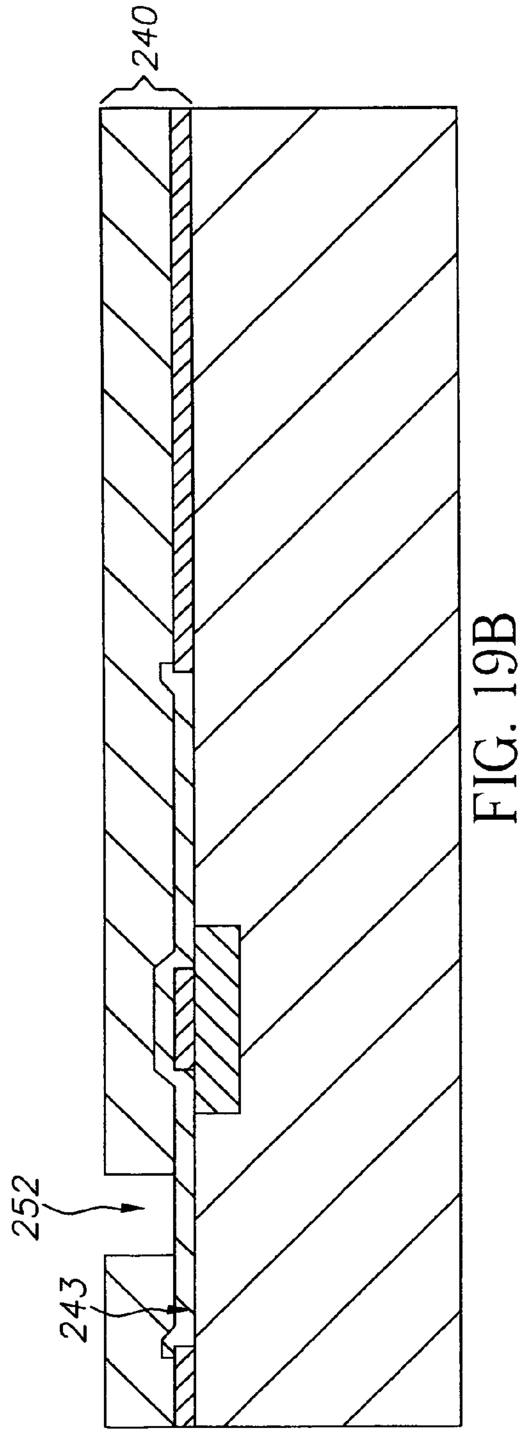
FIG. 19B shows a cross-sectional view, as seen along direction 19-19B.
Figure 20A:
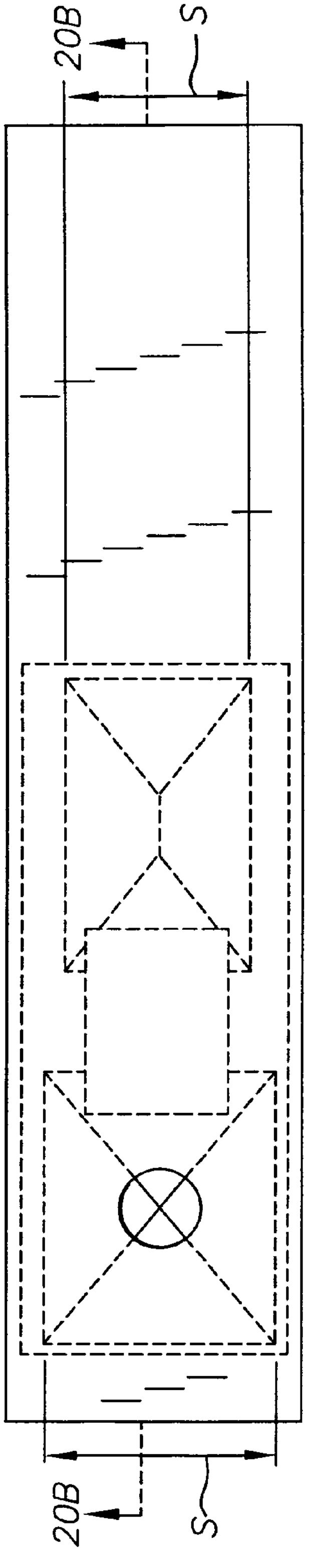
FIG. 20A shows a top view after a subsequent step of etching a fluid chamber and an impedance channel.
Figure 20B:
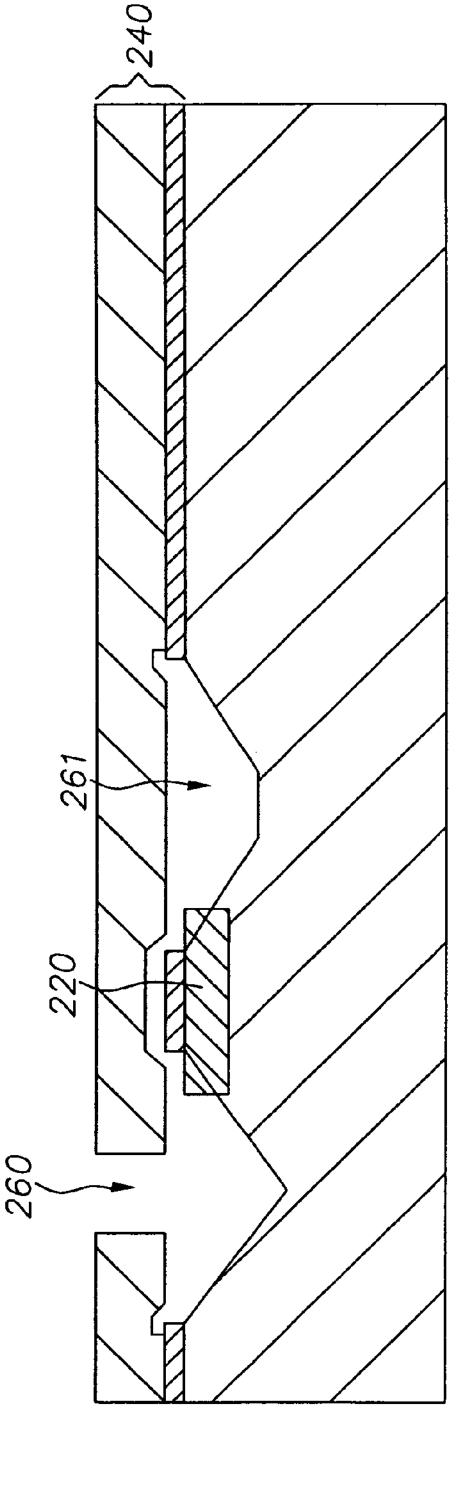
FIG. 20B shows a cross-sectional view, as seen along direction 20B-20B.

FIG. 19 illustrates the step of etching the nozzle 252. FIG. 20 shows the result of etching of the sacrificial layer 243 as well as the fluid chamber 260, and the impedance channel 261 by introducing an etchant through nozzle 252. For the case where the sacrificial layer 243 is polysilicon, it may be etched in the same process step as the orientation dependent etching of the fluid chamber 260 and the impedance channel 261. Alternatively, sacrificial layer 243 is removed using a first etchant. Then the fluid chamber 260 and the impedance channel 261 are orientation dependent etched using a second etchant. Recess-filling temporary material 220 is substantially not affected by either the etch of the sacrificial layer 243 or by the orientation dependent etch step to form the fluid chamber 260 and the impedance channel 261.

Figure 21A:
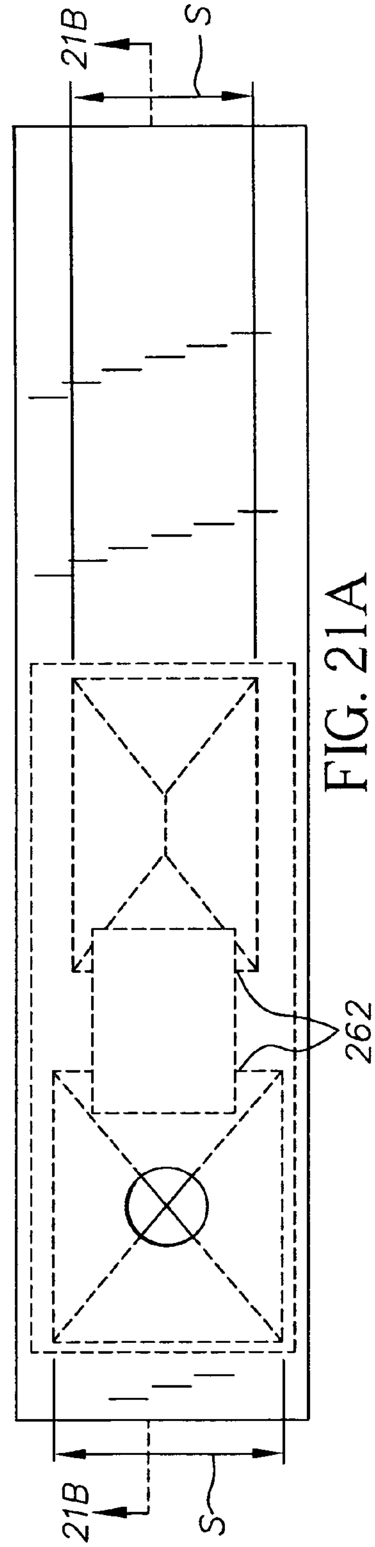
FIG. 21A shows a top view after a subsequent step of removing the temporary material from the recess.
Figure 21B:
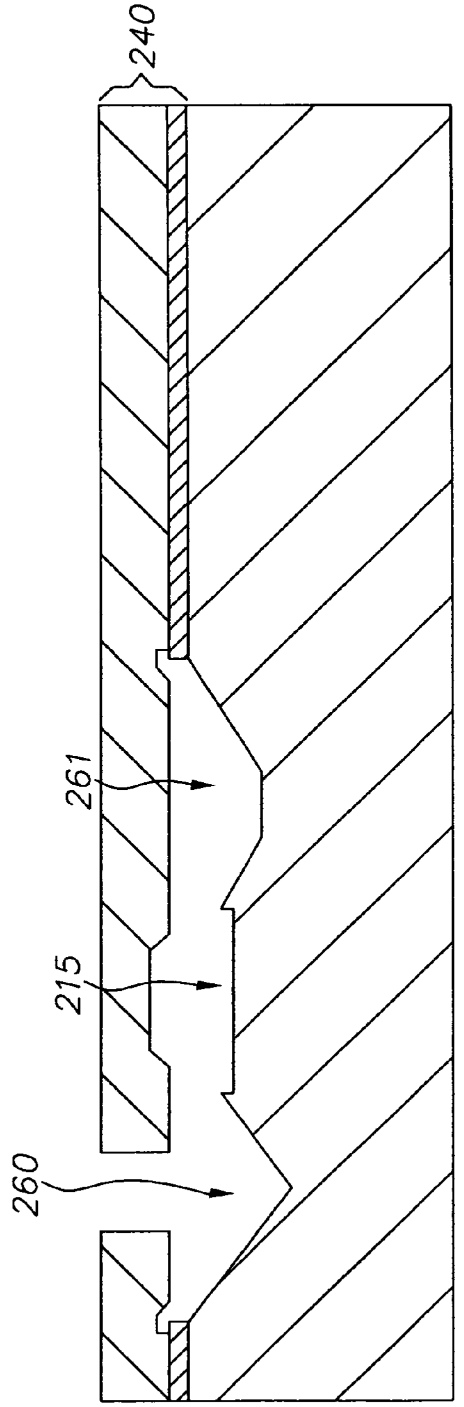
FIG. 21B shows a cross-sectional view, as seen along direction 21B-21B.

FIG. 21 shows the result of etching the recess-filling temporary material 220 from the recess 215 using an etchant which does not substantially affect exposed silicon. The connection between the orientation dependent etched fluid chamber 260 and the orientation dependent etched impedance channel 261 has been made by the interposed recess 215 without affecting the dimensional precision of either feature. Convex corners 262 occur at the intersection of the recess 215 and the fluid chamber 260, as well as at the intersection with impedance channel 261.

Figure 22A:
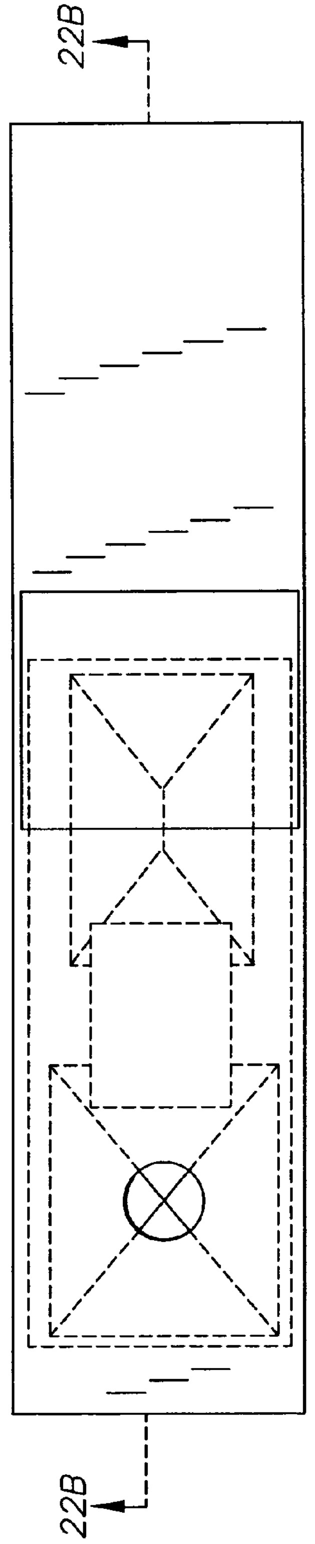
FIG. 22A shows a top view after a subsequent step of forming a fluid delivery channel.
Figure 22B:
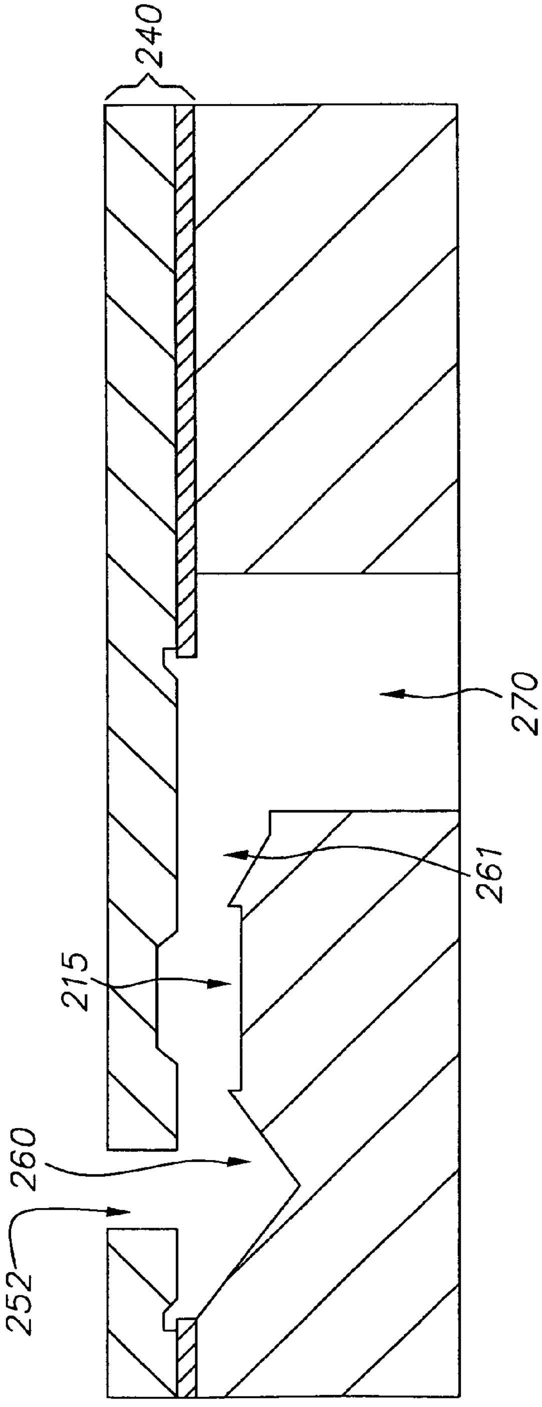
FIG. 22B shows a cross-sectional view, as seen along direction 22B-22B.

FIG. 22 shows a subsequent step of formation of the fluid delivery channel 270 by deep reactive ion etching from the backside of the silicon substrate. The fluid delivery channel is not an inherent part of the present invention of connecting to at least one orientation dependent etched feature having a roof over it, but it does show the completion of a fluid ejecting device.

The invention has been described in detail with particular reference to certain preferred embodiments thereof, but it will be understood that variations and modifications can be effected within the scope of the invention.

PARTS LIST

In the following list, parts having similar functions in the various embodiments are numbered similarly.

11 self-terminated orientation dependent etched pit
12 region protected by masking layer
13 rectangular region where mask layer pattern exposes substrate
21 self-terminated orientation dependent etched pit from end-to-end pit mask
22 region protected by masking layer
23 end-to-end rectangles where mask layer pattern exposes substrate
24 convex corner between two connecting rectangles of different widths
25 line between points on the two sides adjacent to convex corner
31 self-terminated orientation dependent etched pit from T intersection pit mask
32 region protected by masking layer
33 T intersection rectangles where mask layer pattern exposes substrate
34 one rectangle at T intersection
35 a second rectangle at T intersection
36 convex corner at the intersection of the two rectangles
37 line between points on the two sides adjacent to convex corner
41 group of ink channels
42 ink manifold
43 narrow region isolating ink channels from ink manifold
44 channel walls near ink manifold
112 wafer substrate with (100) orientation
113 masking layer
114 region where masking layer is removed to expose wafer substrate
115 etched recess
116 top surface of wafer substrate
119 convex corner between etched recess and orientation dependent etched feature
120 temporary material
121 portion of temporary material coated with masking layer
122 portion of temporary material from which masking layer has been removed
130 masking layer
131 rectangular region from which masking layer has been removed
132 orientation dependent etched feature, partly overlapping etched recess
133 second orientation dependent etched feature, partly overlapping etched recess
212 (100) orientation silicon substrate
215 etched recess
216 first surface of silicon substrate
220 temporary material
240 multilayer stack
241 oxide layer on silicon surface
242 regions of oxide layer which have been patterned away
243 sacrificial layer
244 overlap of sacrificial layer over oxide layer
252 nozzle hole
260 fluid chamber
261 impedance channel
262 convex corners at intersection of recess with fluid chamber and impedance channel
270 fluid delivery channel

The invention claimed is:

1. A method of etching a substrate comprising:

providing a substrate including a first surface and a second surface, the second surface being opposite the first surface;

coating a region of the substrate on the first surface of the substrate with a temporary material having properties that enable the temporary material to remain substantially intact during subsequent processing and enable the temporary material to be removed by a subsequent process that allows the substrate to remain substantially unaltered;

removing a portion of the substrate by etching from the first surface of the substrate to form a feature in the substrate while allowing the temporary material to remain substantially intact such that a portion of the temporary material overlaps a portion of the feature; and removing the temporary material by etching from the first surface of the substrate while allowing the substrate to remain substantially unaltered.

2. The method according to claim 1, wherein providing the substrate comprises removing some of the substrate to form a recess.

3. The method according to claim 2, wherein coating the region of the substrate with the temporary material comprises coating the recess.

4. The method according to claim 2, wherein coating the region of the substrate with the temporary material comprises filling the recess with the temporary material.

5. The method according to claim 2, wherein removing some of the substrate to form the recess comprises forming the recess using an orientation dependent etching process.

6. The method according to claim 2, wherein removing some of the substrate to form the recess comprises forming the recess using an isotropic etching process.

7. The method according to claim 2, wherein removing some of the substrate to form the recess comprises forming the recess using a reactive ion etching process.

8. The method according to claim 1, wherein removing the portion of the substrate to form the feature comprises forming the feature using an orientation dependent etching process.

9. The method according to claim 1, wherein removing the temporary material while allowing the substrate to remain substantially unaltered causes the feature and the formerly coated region of the substrate to connect.

10. The method according to claim 9, wherein the feature and the formerly coated region of the substrate connect to form at least one convex corner.

11. The method according to claim 1, wherein removing the portion of the substrate to form the feature comprises forming a plurality of features using an orientation dependent etching process.

12. The method according to claim 11, wherein removing the temporary material while allowing the substrate to remain substantially unaltered causes the plurality of features and the formerly coated region of the substrate to connect.

13. The method according to claim 11, wherein the coated region of the substrate is shaped to connect at least some of the plurality of features.

14. The method according to claim 11, each of the plurality of features having a depth, wherein two of the depths are unequal.

15. The method according to claim 1, wherein coating the region of the substrate with the temporary material includes coating a discontinuous region with the temporary material.

16. The method according to claim 1, wherein providing the substrate comprises removing some of the substrate to form a plurality of recesses.

17. The method according to claim 16, wherein coating the region of the substrate with the temporary material comprises coating each of the plurality of recesses.

18. The method according to claim 1, wherein the temporary material is TEOS.

19. The method according to claim 1, wherein the temporary material is a glass material.

20. The method according to claim 1, wherein the substrate is a monocrystalline substrate having a (100) orientation.

21. The method according to claim 20, wherein the substrate is a silicon substrate.

22. The method according to claim 1, further comprising:

depositing a first material layer on the surface of the substrate, the first material layer being differentially etchable with respect to the substrate;

removing a portion of the first material layer thereby forming a patterned first material layer and defining the feature boundary location;

depositing a sacrificial material layer over the patterned first layer;

removing a portion of the sacrificial material layer thereby forming a patterned sacrificial material layer and further defining the feature boundary location;

depositing at least one additional material layer over the patterned sacrificial material layer;

forming a hole extending from the at least one additional material layer to the sacrificial material layer, the hole being positioned within the feature boundary location; and removing the patterned sacrificial material layer by introducing an etchant through the hole.

23. The method according to claim 22, wherein removing the portion of the substrate to form the feature comprises:

forming the feature by introducing an etchant through the hole.

24. The method according to claim 23, wherein depositing the first material layer on the surface of the substrate occurs after coating the region of the substrate with the temporary material.

25. The method according to claim 24, wherein removing the portion of the substrate to form the feature occurs after removing the patterned sacrificial material layer.

26. The method according to claim 24, wherein removing the portion of the substrate to form the feature occurs when removing the patterned sacrificial material layer.

27. The method according to claim 23, wherein removing the portion of the substrate to form the feature occurs after removing the patterned sacrificial material layer.

28. The method according to claim 23, wherein removing the portion of the substrate to form the feature occurs when removing the patterned sacrificial material layer.

29. A method of etching a substrate comprising:

providing a substrate including a recess, a first surface, and a second surface, the second surface being opposite the first surface;

coating the recess of the substrate from a direction of the first surface of the substrate with a temporary material having properties that enable the temporary material to remain substantially intact during subsequent processing and enable the temporary material to be removed by a subsequent process that allows the substrate to remain substantially unaltered;

removing a portion of the substrate by etching from the direction of the first surface of the substrate using a self-terminated orientation dependent etching process to form a feature in the substrate while allowing the temporary material to remain substantially intact such that a portion of the temporary material overlaps a portion of the feature; and removing the temporary material from the recess by etching from the direction of the first surface of the substrate while allowing the substrate to remain substantially unaltered.

30. The method according to claim 29, wherein providing the substrate including the recess and the surface includes forming the recess using a reactive ion etching process.

31. The method according to claim 29, wherein removing the temporary material while allowing the substrate to remain substantially unaltered causes the feature and the recess of the substrate to connect to each other forming at least one convex corner.

32. The method according to claim 29, wherein removing the portion of the substrate to form the feature comprises forming a plurality of features using an orientation dependent etching process.

33. The method according to claim 32, wherein removing the temporary material while allowing the substrate to remain substantially unaltered causes the plurality of features and the recess of the substrate to connect to each other.

34. The method according to claim 32, wherein the coated region of the substrate is shaped to connect at least some of the plurality of features.

35. The method according to claim 32, each of the plurality of features having a depth, wherein two of the depths are unequal.

36. The method according to claim 29, wherein the substrate is a monocrystalline silicon substrate having a (100) orientation.

37. The method according to claim 29, further comprising:

depositing a first material layer on the surface of the substrate, the first material layer being differentially etchable with respect to the substrate;

removing a portion of the first material layer thereby forming a patterned first material layer and defining the feature boundary location;

depositing a sacrificial material layer over the patterned first layer;

removing a portion of the sacrificial material layer thereby forming a patterned sacrificial material layer and further defining the feature boundary location;

depositing at least one additional material layer over the patterned sacrificial material layer;

forming a hole extending from the at least one additional material layer to the sacrificial material layer, the hole being positioned within the feature boundary location; and removing the patterned sacrificial material layer by introducing an etchant through the hole.

38. The method according to claim 37, wherein removing the portion of the substrate to form the feature comprises:

forming the feature by introducing an etchant through the hole.

* * * * *